United States Patent
Ek et al.

(10) Patent No.: US 9,356,609 B1
(45) Date of Patent: May 31, 2016

(54) PHASE SWITCHING PLL AND CALIBRATION METHOD

(71) Applicant: Telefonaktiebolaget L M Ericsson (publ), Stockholm (SE)

(72) Inventors: Staffan Ek, Lund (SE); Tony Påhlsson, Lund (SE); Henrik Sjöland, Lund (SE); Lars Sundström, Södra Sandby (SE)

(73) Assignee: TELEFONAKTIEBOLAGET L M ERICSSON (PUBL), Stockholm (SE)

(*) Notice: Subject to any disclaimer, the term of this patent is extended or adjusted under 35 U.S.C. 154(b) by 0 days.

(21) Appl. No.: 14/576,691

(22) Filed: Dec. 19, 2014

(51) Int. Cl.
*H03L 7/06* (2006.01)
*H03L 7/08* (2006.01)

(52) U.S. Cl.
CPC .................................. *H03L 7/08* (2013.01)

(58) Field of Classification Search
None
See application file for complete search history.

(56) References Cited

U.S. PATENT DOCUMENTS

| | | | |
|---|---|---|---|
| 6,734,749 B2 | 5/2004 | Mattison et al. | |
| 7,352,249 B2 * | 4/2008 | Balboni | H03C 3/0925 327/157 |
| 7,894,545 B1 | 2/2011 | Groe | |
| 2006/0139105 A1 | 6/2006 | Maxim et al. | |
| 2008/0106339 A1 | 5/2008 | Adlerstein | |
| 2010/0127739 A1 | 5/2010 | Ebuchi et al. | |
| 2010/0134163 A1 | 6/2010 | Kawamoto | |
| 2011/0133794 A1 * | 6/2011 | Dunworth | H03L 7/093 327/156 |
| 2012/0133403 A1 * | 5/2012 | Miyanaga | H03L 7/083 327/156 |

OTHER PUBLICATIONS

Axholt, A., "Micro- and Millimeter Wave CMOS Beamforming Receivers", Jun. 1, 2011, pp. 1-127, Lund Insitute of Technology.

* cited by examiner

*Primary Examiner* — Cassandra Cox
(74) *Attorney, Agent, or Firm* — Coats & Bennett, PLLC

(57) ABSTRACT

The phase-locked loop (PLL) presented herein controls the phase of the output of the PLL. To that end, the PLL includes an oscillator that generates an output signal at an output of the PLL responsive to a comparison between a reference signal input to the PLL and a feedback signal derived from the output signal. To control the phase of the output signal, a modulation signal is applied to one input of the oscillator, separate from the reference signal input, where the modulation signal comprises one or more pulses having a total area defined based on the desired phase shift. To maintain the desired phase shift at the output of the PLL, the PLL also sets a time relationship between the reference signal and the feedback signal based on the desired phase shift.

29 Claims, 21 Drawing Sheets

PHASE SWITCHING PLL AND CALIBRATION METHOD

The present invention relates generally to wireless communications systems, and more particularly to controlling the phase of a signal at an antenna element of an antenna array of a beamforming transmitter and/or receiver.

BACKGROUND

Beamforming systems in wireless networks, e.g., beamforming transmitters, receivers, and/or transceivers, provide directional signal transmission or reception by combining signals transmitted from or received by antenna elements of an antenna array such that signals at particular angles experience constructive interference, while others experience destructive interference. Such directional transmission/reception provides improved coverage and less interference in the wireless network.

The directional control of a beamforming system may be achieved by controlling the phase and relative amplitude of the signal applied to each antenna element. Thus, the performance of the beamforming system is inextricably tied to the accuracy of the phase control of each antenna element. Some systems implement local oscillator beamforming, which involves phase shifting the local oscillator signal for each antenna element to achieve the desired phase shift for the antenna element. Such solutions, however, do not always provide the desired phase shift quickly enough. In particular, if the time needed to shift the phase is too large to allow a change of phase between two consecutive data frames (transmitted or received) without significantly affecting the transmission or reception, the performance of the beamforming system will degrade. There is therefore a need for faster, and thus, improved phase control for beamforming systems.

SUMMARY

The solution presented herein uses a phase-locked loop (PLL) for each antenna element of an antenna array to control the frequency and phase of the signals applied to each antenna element, and thus to control the directional properties of the antenna array. The PLL includes an oscillator that generates an output signal at an output of the PLL responsive to a comparison between a reference signal input to the PLL and a feedback signal derived from the output signal. To control the phase of the output signal, a modulation signal is applied to an auxiliary control input of the oscillator, separate from a primary control input, where the modulation signal comprises one or more pulses having a total area defined based on the desired phase shift. To maintain the desired phase shift at the output of the PLL, the PLL also sets a time relationship between the reference signal and the feedback signal based on the desired phase shift.

In one exemplary embodiment, a PLL comprises an oscillator, a detector, and a phase control system. The oscillator is configured to generate an output signal at an output of the PLL responsive to a reference signal input to the PLL, where the oscillator includes a primary control input and a separate auxiliary control input. The detector is configured to compare the reference signal to a feedback signal to generate one or more PLL control signals, where the feedback signal is derived by a feedback loop of the PLL from the output signal. The phase control system is configured to control a phase of the output signal to achieve a desired phase shift at the output of the PLL. To that end, the phase control system comprises a modulation circuit and a phase skew circuit. The modulation circuit is operatively coupled to the oscillator and is configured to execute open-loop phase control of the PLL by generating a phase modulation signal comprising one or more pulses having a total area defined based on the desired phase shift, and by applying the phase modulation signal to the auxiliary control input to change the phase of the output of the PLL to achieve the desired phase shift. The phase skew circuit is configured to execute closed-loop phase control of the PLL to maintain the phase of the output of the PLL at the desired phase shift by setting a time relationship between the reference signal and the feedback signal based on the desired phase shift.

Another exemplary embodiment provides a method of controlling a phase at an output of a phase-locked loop (PLL) to achieve a desired phase shift at the output of the PLL. The PLL comprises an oscillator configured to generate an output signal at the output of the PLL responsive to a reference signal input to the PLL, where the oscillator includes a primary control input and a separate auxiliary control input. The PLL also comprises a detector configured to compare the reference signal to a feedback signal to generate one or more PLL control signals, where the feedback signal is derived by a feedback loop of the PLL from the output signal. The method comprises executing open-loop phase control of the PLL by generating a phase modulation signal comprising one or more pulses having a total area defined based on the desired phase shift, and applying the phase modulation signal to the auxiliary control input to change the phase of the output of the PLL to achieve the desired phase shift. The method further comprises executing closed-loop phase control of the PLL to maintain the phase of the output of the PLL at the desired phase shift by setting a time relationship between the reference signal and the feedback signal based on the desired phase shift.

Another exemplary embodiment provides a method of calibrating open-loop phase control of a PLL to achieve a desired phase shift at an output of the PLL. The PLL comprises an oscillator configured to generate an output signal at the output of the PLL responsive to a reference signal input to the PLL. The oscillator includes a primary control input and a separate auxiliary control input. The PLL also comprises a detector configured to compare the reference signal to a feedback signal to generate one or more PLL control signals, where the feedback signal is derived by a feedback loop of the PLL from the output of the PLL. The method comprises applying a phase modulation signal comprising one or more pulses to the auxiliary control input, wherein the phase modulation signal is defined based on an estimate of a total area of the one or more pulses necessary to achieve the desired phase shift. The method further comprises changing a time relationship between the reference signal and the feedback signal based on the desired phase shift, and measuring a first frequency control signal of the PLL at a first time during a settling period of the PLL. The method further includes calibrating the phase modulation signal based on the first frequency control signal.

Another exemplary embodiment provides a calibration system for calibrating open-loop phase control of a PLL to achieve a desired phase shift at an output of the PLL. The PLL comprises an oscillator configured to generate an output signal at the output of the PLL responsive to a reference signal input to the PLL, where the oscillator includes a primary control input and a separate auxiliary control input. The PLL further comprises a detector configured to compare the reference signal to a feedback signal to generate one or more PLL control signals, where the feedback signal is derived by a feedback loop of the PLL from the output of the PLL. The calibration system comprises a modulation circuit, a phase skew circuit, a measurement circuit, and a control circuit. The modulation circuit is configured to apply a phase modulation signal comprising one or more pulses to the auxiliary control input, where the phase modulation signal is defined based on an estimate of a total area of the one or more pulses necessary to achieve the desired phase shift. The phase skew circuit is configured to change a time relationship between the reference signal and the feedback signal based on the desired phase shift. The measurement circuit is configured to measure a first frequency control signal of the PLL at a first time during a settling period of the PLL. The control circuit is configured to calibrate the phase modulation signal based on the first frequency control signal.

DETAILED DESCRIPTION

Figure 1A:
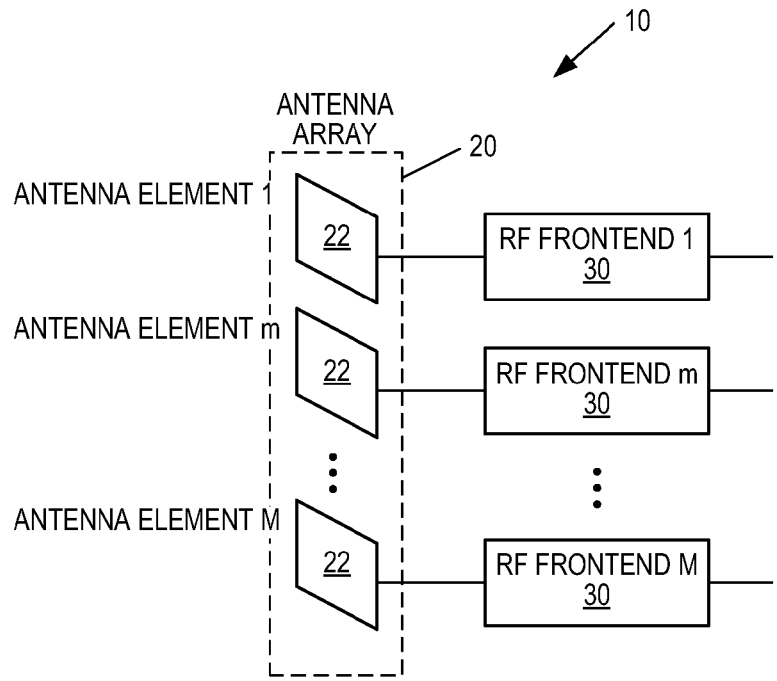
FIG. 1A shows an exemplary block diagram for beamforming system.
Figure 1B:
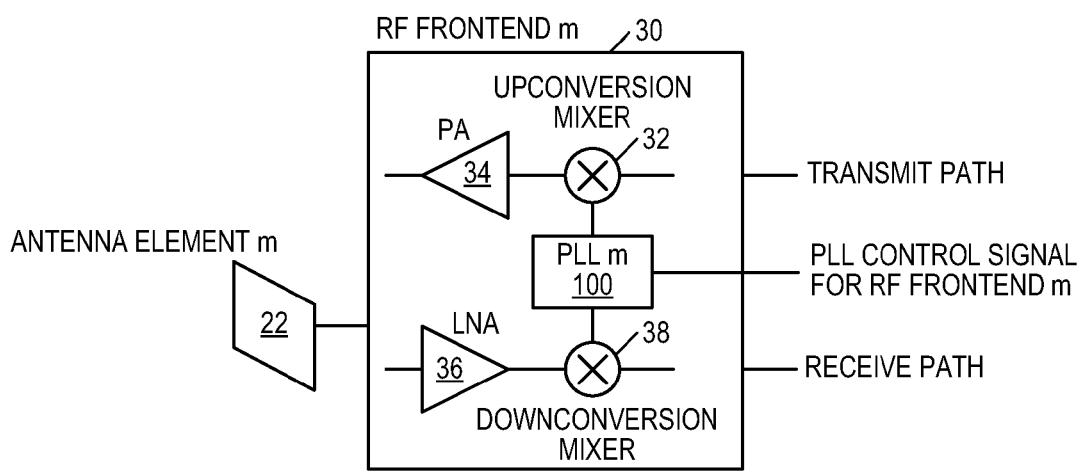
FIG. 1B shows an exemplary block diagram for an RF front-end for the beamforming system of FIG. 1A.

FIG. 1A shows a beamforming system 10 comprising an antenna array 20 with M antenna elements 22, where each antenna element 22 is coupled to a corresponding radio frequency (RF) front end 30. Each RF front end 30 comprises a phase-locked loop (PLL) 100 coupled to a transmission path and a reception path, as shown in FIG. 1B. An upconversion mixer 32 operatively coupled to the output of the PLL 100 upconverts an input signal responsive to the frequency of the output signal supplied by the PLL 100. An amplifier 34, e.g., a power amplifier, amplifies the upconverted signal for transmission by the corresponding antenna element 22. An amplifier 36, e.g., a low-noise amplifier amplifies signals received by the corresponding antenna element 22. A downconversion mixer 38 downconverts the received and amplified signal responsive to the frequency of the output signal supplied by the PLL 100. To control the direction of the beam for the antenna element 22, the PLL 100 controls the phase of the PLL output signal responsive to an input control signal input to the PLL 100 relative to the reference clock. In some embodiments, the PLL control signal indicates the desired phase shift of the PLL output signal, where the desired phase shift was determined by a controller (not shown) external to the PLL 100, e.g., an array controller, based on a location of the antenna element 22 in the antenna array 20, a desired beam direction, and/or a desired beam shape. In other embodiments, the PLL control signal indicates the location of the antenna element 22 in the antenna array 20, the desired beam direction, and/or the desired beam shape, and the PLL 100 determines or otherwise selects the desired phase shift based on the information provided by the PLL control signal. It will be appreciated that FIGS. 1A and 1B show simplified block diagrams of the exemplary beamforming system 10 and RF front-end 30. Thus, other components not pertinent to the discussion have been excluded from the drawings for simplicity.

Figure 2:
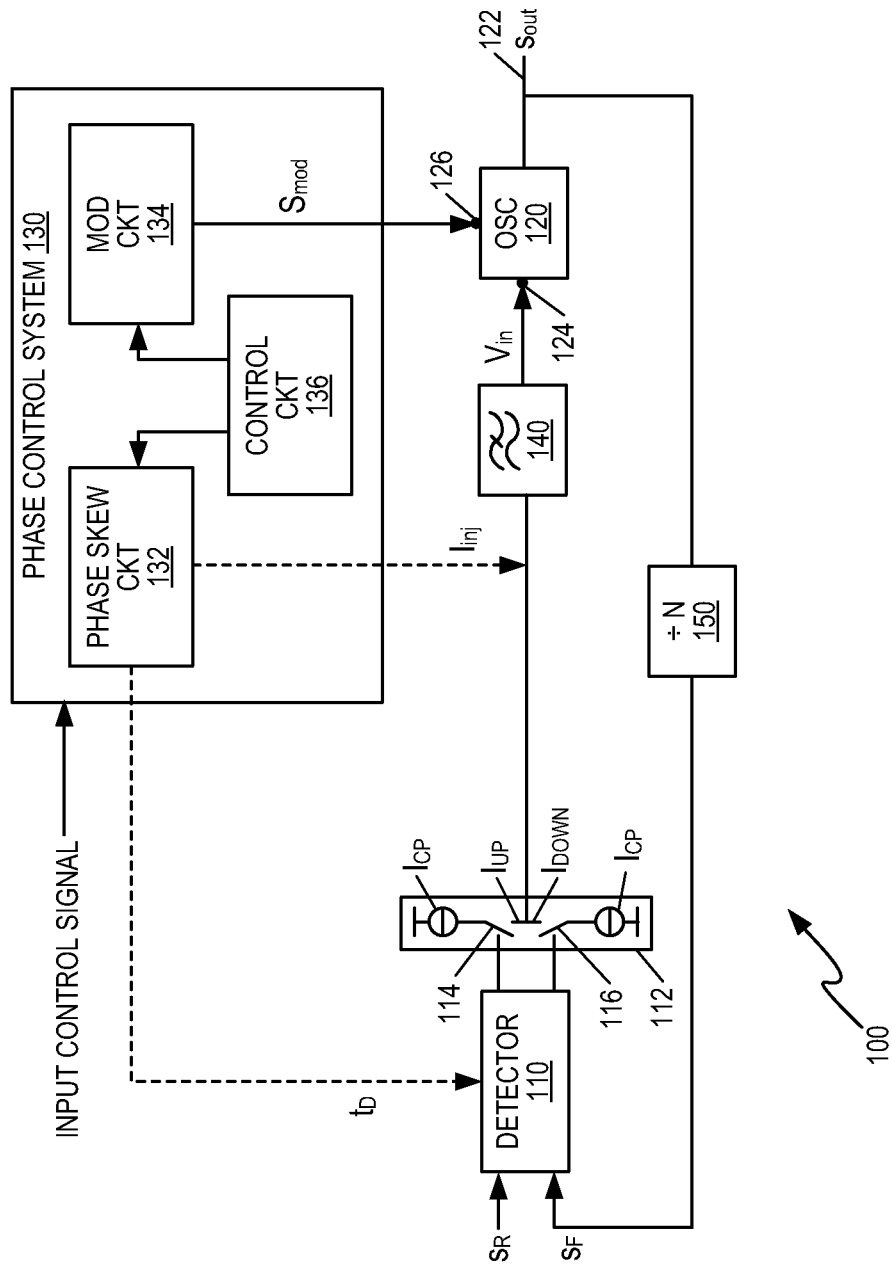
FIG. 2 shows a block diagram of a PLL according to one exemplary embodiment.

FIG. 2 shows an exemplary PLL 100 comprising a detector 110, a charge pump (CP) 112, an oscillator 120, a phase control system 130, a loop filter 140, and a divider 150. Oscillator 120, which may comprise a voltage-controlled oscillator (VCO), comprises an output 122, a primary control input 124, and an auxiliary control input 124 separate from the primary control input 124. The oscillator 120 generates an output signal $s_{out}$ having an output frequency $f_{out}$ at the output 122 responsive to a reference signal $s_R$ having a reference frequency $f_R$ input to the detector 110. The divider 150 generates a feedback signal $s_F$ having a feedback frequency $f_F$ from the output signal $s_{out}$, e.g., by dividing the output frequency $f_{out}$ by N to generate the feedback signal $f_F$, where N may comprise an integer or a rational number. The detector 110 compares the reference frequency $f_R$ to the feedback frequency $f_F$ to generate one or more PLL control signals output by the detector 110. The PLL control signal(s) output by the detector 110, which comprise a charge up signal and a charge down signal, control the charge pump 112 to inject current into the loop filter 140, as described in further detail below, where the output of the current injection system 112 is input to the filter 140. The filtered signal $v_{in}$ output by the filter 140 is applied to the primary oscillator input 124. When locked, the output signal $s_{out}$ has a frequency $f_{out}$ that is N times that of the frequency $f_R$ of the input reference signal $s_R$.

Figure 3:
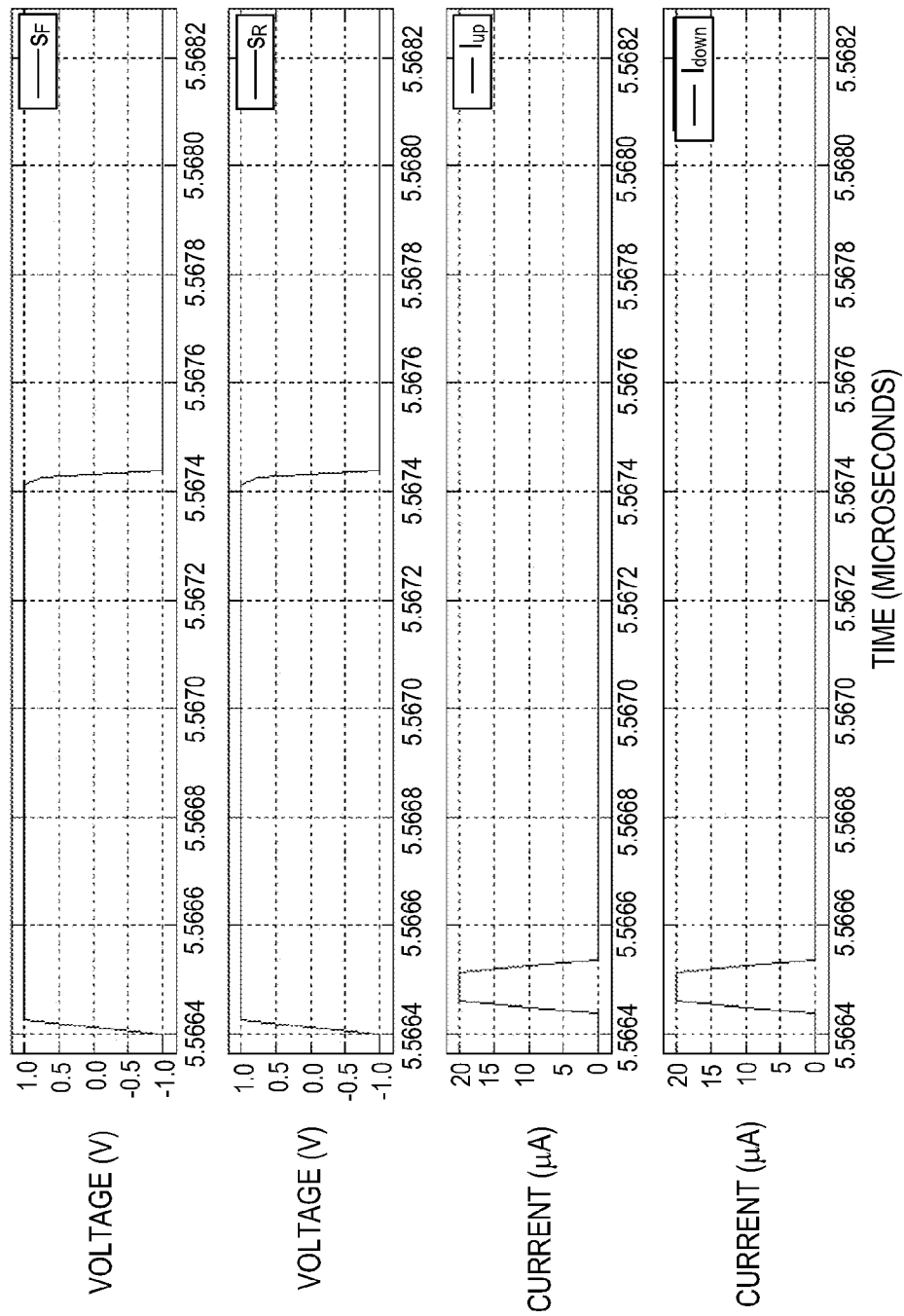
FIG. 3 shows exemplary transient waveforms for the PLL of FIG. 2 when no phase shift is added.

The detector 110 outputs the charge up signal to close the top switch 114 of the charge pump 112 if the positive edge of $s_R$ arrives earlier than the positive edge of $s_F$. Closing top switch 114 causes the charge pump 112 to output $I_{up}$, which charges the loop filter 140 and increases $v_{in}$ by injecting current into the filter 140, which in turn increases the frequency $f_{out}$ of $s_{out}$. If the positive edge of $s_R$ arrives later than the positive edge of $s_F$, the detector 110 outputs the charge down signal to close the bottom switch 116 of the charge pump 112 to leak current out of the filter 140. Closing bottom switch 116 causes the charge pump 112 to output $I_{down}$ which discharges the loop filter 140 and decreases $v_{in}$, which in turn decreases the frequency $f_{out}$ of $s_{out}$. When $s_R$ and $s_F$ arrive at the same time, the charge pump 112 is idle. When the PLL 100 is locked, $s_{out}$ has a frequency $f_{out}$ equal to $Nf_R$, and the oscillator 120 maintains a constant phase with respect to $Nf_R$. FIG. 3 shows exemplary transient waveforms for $s_F$, $s_R$, $I_{up}$, and $I_{down}$ when the PLL 100 does not add a phase shift. The charge pump 112 shown in FIGS. 2 and 5 comprises, for example, an analog charge pump.

Figure 4:
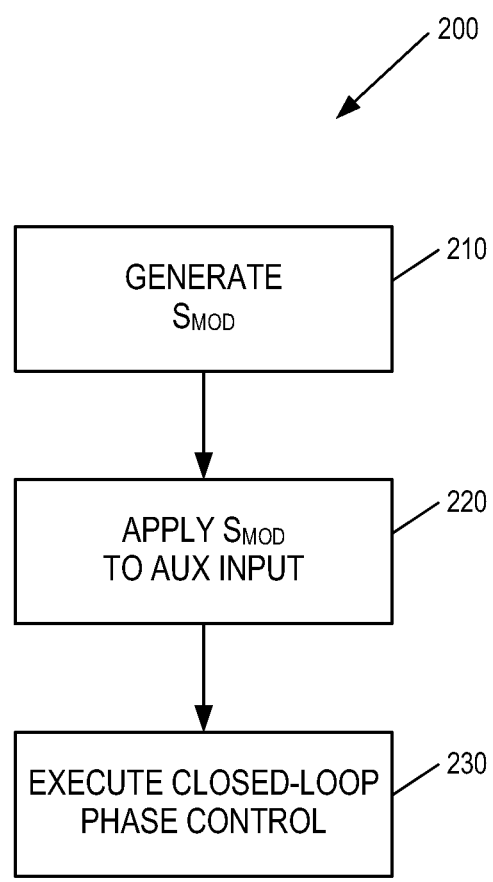
FIG. 4 shows a phase control method according to one exemplary embodiment.

To change the phase of the PLL 100 to achieve a desired phase shift Δϕ at the output 122 of the PLL 100, the solution presented herein adds phase control system 130 to the PLL 100, as shown in FIG. 2, to implement the method 200 of FIG. 4. The phase control system 130 executes open-loop phase control by generating a phase modulation signal $S_{mod}$ (block 210), and applying $S_{mod}$ to the auxiliary control input 126 of the oscillator 120 (block 220). The generated phase modulation signal $S_{mod}$ comprises one or more pulses having a total area defined based on the desired phase shift Δϕ. To maintain the phase of the oscillator output 122 at the desired phase shift Δϕ, the phase control system 130 also executes closed-loop phase control by setting a time relationship between $s_R$ and $s_F$ based on the desired phase shift Δϕ (block 230). The pulse(s) that modulate the oscillator 120 during the open-loop phase control could last for one or more cycles of the reference frequency, which will typically improve the speed of the phase switching by at least a factor of 100 relative to the closed-loop phase control solution.

Phase control system 130 comprises a phase skew circuit 132, a modulation circuit 134, and a control circuit 136. Control circuit 136 controls the modulation circuit 134 to outputs $S_{mod}$ responsive to the desired phase shift Δϕ to execute the open-loop phase control. Further, control circuit 136 controls the phase skew circuit 132 responsive to the desired phase shift Δϕ to execute the closed-loop phase control. The control circuit 136 may determine the desired phase shift Δϕ from information provided by the input control signal, e.g., and control the modulation and phase skew circuits based on the determined phase shift Δϕ. In other embodiments, the control circuit 136 may control the modulation and phase skew circuits based on the desired phase shift Δϕ provided by the input control signal.

The modulation circuit 134 generates the phase modulation signal $S_{mod}$, which as noted above, includes one or more pulses having a total area defined based on the desired phase shift Δϕ. For example, the desired phase shift Δϕ may be defined according to:

$$\Delta \phi = 2\pi \cdot G \cdot A(t) \cdot \Delta t, \qquad (1)$$

where G represents a gain (frequency unit per amplitude unit, e.g., Hz/V), of the auxiliary input 126 and A(t) represents the amplitude of the phase modulation signal at time t. The total area of the pulses of the phase modulation signal is therefore the product (or integral) of the total amplitude, e.g., G·A(t), multiplied by the total time Δt (or dt) of the one or more pulses. To achieve the desired phase shift Δϕ, the modulation circuit 134 controls the amplitude A(t) of the one or more pulses and/or the total duration Δt of the one or more pulses. For example, the modulation circuit 134 may fix the amplitude of the pulse(s) and adjust the duration Δt of the pulse(s) to achieve the desired phase shift Δϕ. Alternatively, the modulation circuit 134 may fix the duration Δt and adjust the amplitude A(t) to achieve the desired phase shift Δϕ. In yet another alternative, the modulation circuit 134 may adjust both the amplitude A(t) and the duration Δt to achieve the desired phase shift Δϕ.

Figure 5:
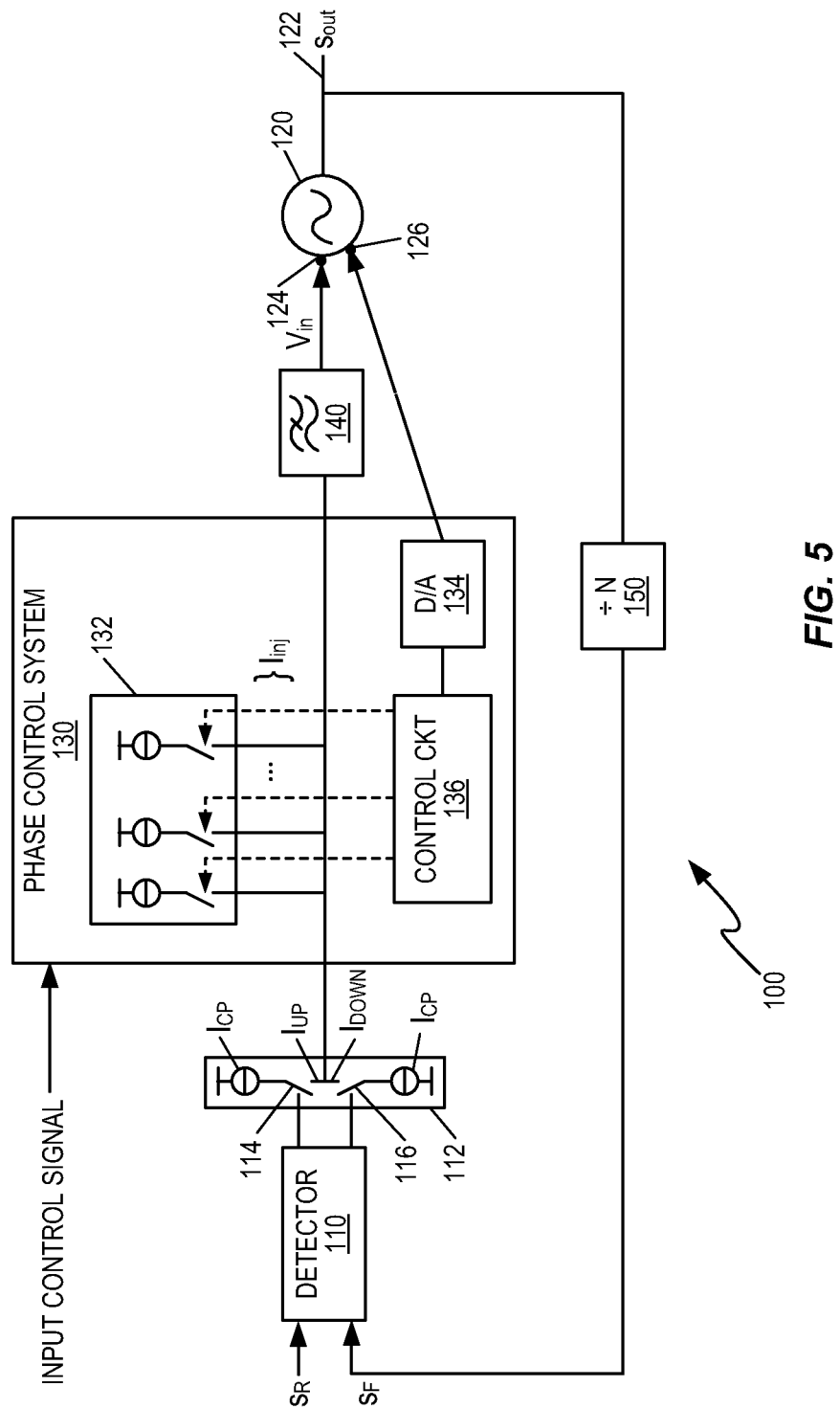
FIG. 5 shows a block diagram of a PLL according to another exemplary embodiment.

In one embodiment, e.g., when the oscillator 120 comprises an analog oscillator, the modulation circuit 134 comprises a digital-to-analog converter (DAC), as shown in FIG. 5. The DAC applies a phase modulation signal responsive to the control circuit 136, as shown in FIG. 5. It will be appreciated that other circuits may be used to provide the phase modulation signal to the auxiliary input 126 of the oscillator 120. For example, when the oscillator 120 comprises an LC voltage controlled oscillator, the modulation circuit 134 may comprise an additional varactor or switchable capacitor. In another example, e.g., when the oscillator 120 comprises a digital controlled oscillator, the control circuit 136 may provide a digital phase modulation signal having the one or more pulses with the desired total area directly to the oscillator 136.

Figure 6:
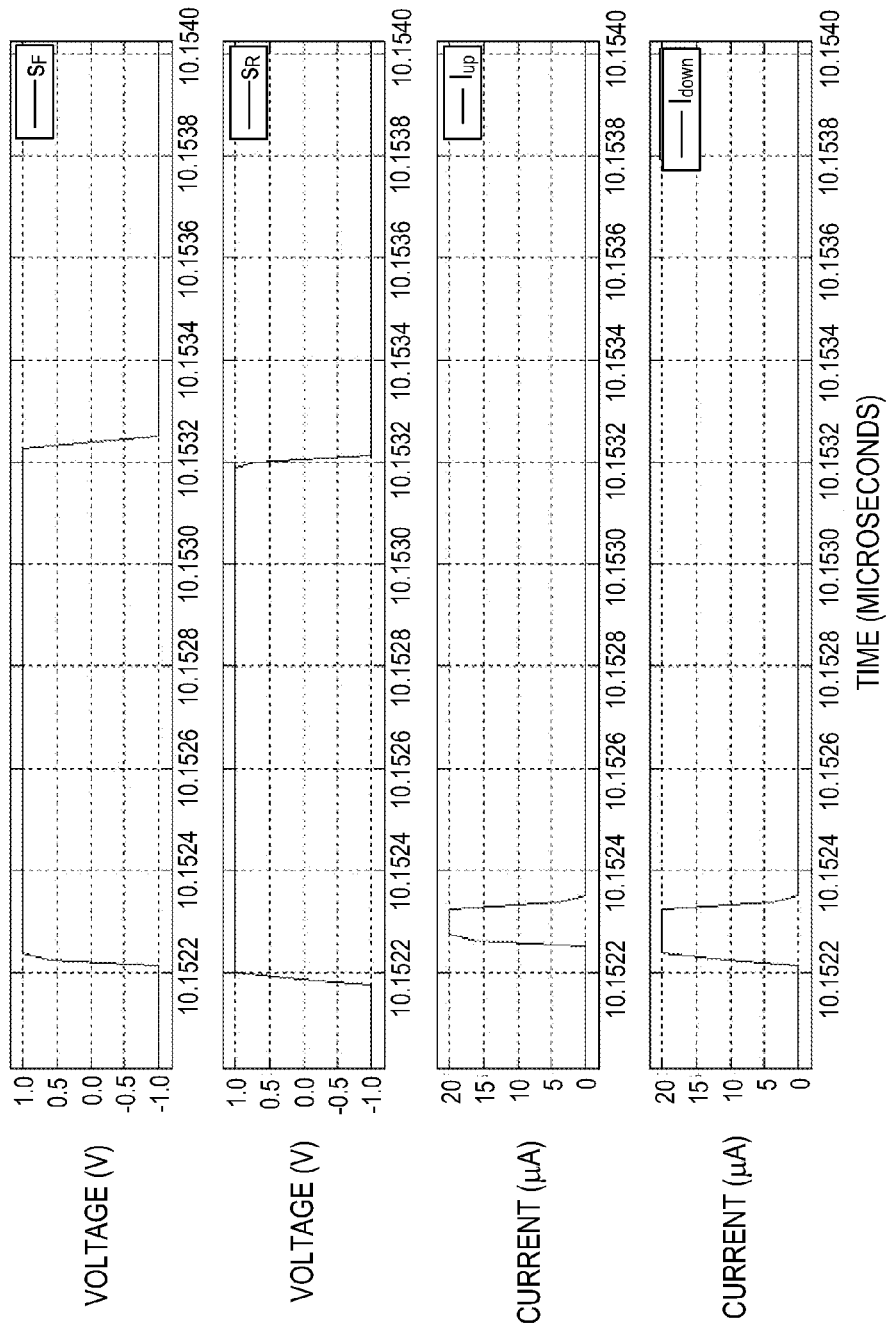
FIG. 6 shows exemplary transient waveforms for the PLL of FIG. 5 when a phase shift is added.

The phase skew circuit 132 maintains the desired phase shift Δϕ by controlling or otherwise setting the time relationship between $s_R$ and $s_F$. Phase skew circuit 132 may begin its phase control process before, at the same time as, or after the modulation circuit 134. In so doing, the phase skew circuit 132 changes the current injected into the loop filter 140, which is in turn compensated for by the charge pump 112. In one embodiment, the phase skew circuit 132 comprises a set of current injectors that set the time relationship between $s_R$ and $s_F$ by injecting current directly into or leaking current out of the loop filter 140, as shown in FIG. 5. The injected/leaked current $I_{inj}$ may be static or pulsed current. The charge pump 112 compensates for the current injected into/leaked out of the loop filter 140 through increased duty cycle of the down-pulses, which creates the desired phase shift at the oscillator output 122. The injected/leaked current $I_{inj}$ is defined based on the desired phase shift Δϕ. For example, the relationship between the injected/leaked current $I_{inj}$ and the desired phase shift Δϕ may be defined according to:

$$\Delta \phi = 2\pi \cdot N \cdot \frac{I_{inj}}{I_{cp}}, \qquad (2)$$

where $I_{cp}$ represents the current ($I_{up}$ or $I_{down}$) output by charge pump 112. Thus, for this example, the phase skew circuit 132 may achieve the desired phase shift by setting the magnitude of the injected/leaked current $I_{inj}$. FIG. 6 shows exemplary transient waveforms for $s_F$, $s_R$, $I_{up}$, and $I_{down}$ when the PLL 100 injects current into the loop filter 140 to add a phase shift.

In another embodiment, the phase skew circuit 132 may set the time relationship between $s_R$ and $s_F$ by applying a delay $t_D$ to the detector 110 based on the desired phase shift Δϕ. The phase skew circuit 132 may set this time relationship by applying the delay $t_D$ to $s_R$, applying the delay $t_D$ to $s_F$, and/or by applying the delay $t_D$ somewhere in detector 110 before the detector 110 compares $s_R$ and $s_F$. It will be appreciated that it does not matter how the phase skew circuit 132, coupled with the detector 110, uses $t_D$ to set the time delay, so long as the delay is applied before the detector 110 compares the reference and feedback signals. As noted above, changing this time relationship changes the current injected by the charge pump 112 into the loop filter 140, e.g., by changing whether the charge up or charge down signal is applied, and thus changes the phase at the oscillator output 122. Thus, by selecting the delay $t_D$ based on the desired phase shift Δϕ, changing the time relationship between $s_R$ and $s_F$ by the delay $t_D$ achieves the desired phase shift Δϕ at the oscillator output 122 without changing the output frequency.

The PLL loop bandwidth limits how quickly the PLL 100 can change the phase using just the phase skew circuit 132, and thus how quickly the PLL 100 can change the beam angle and user. Typically, the PLL loop bandwidth is on the order of 1 MHz (or less). Switching in the injected current, for example, may take several micro-seconds, and therefore would require a sufficiently large guard time while the phase is changed, especially when users are time-multiplexed. FIG.

Figure 7:
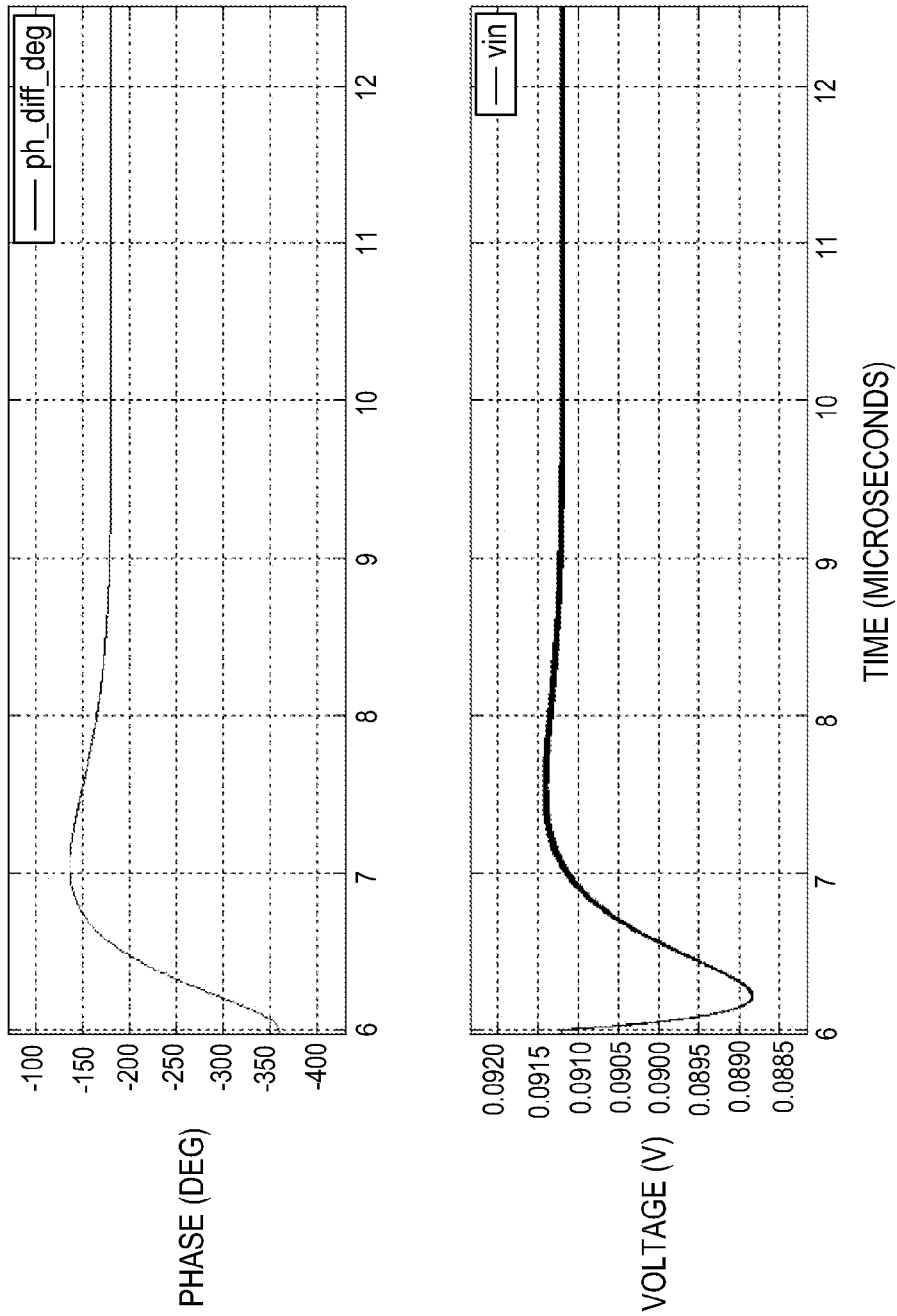
FIG. 7 shows the $\Delta\phi$ and $v_{in}$ performance for the PLL of FIG. 5 when the desired phase shift is 180° and when only closed-loop phase control is implemented.

7 demonstrates the delay present with the closed-loop solution provided by the phase skew circuit 132. In particular, FIG. 7 shows the phase relation when performing a 180° phase shift with a 15 GHz output PLL. The PLL loop has a 500 kHz bandwidth and a 500 MHz/V oscillator sensitivity. As shown in FIG. 7, the loop settles to a few degrees of phase accuracy within 4 µs. Because the oscillator frequency is directly proportional to $v_{in}$, it can be seen that the phase shift is done by first decreasing and then increasing the frequency. If the guard time is significant relative to the duration of the smallest frame of data to be received or transmitted with the new beam angle, the link capacity will decrease. Because a switching time of several micro-seconds is anticipated to be on the same order of magnitude as the duration of a frame in a prospective future millimeter wave frequency (mmW)-based air interface, the associated guard time is expected to be much larger than the cyclic prefix of an Orthogonal Frequency Division Multiplex (OFDM) transmission of such an air interface.

Figure 8:
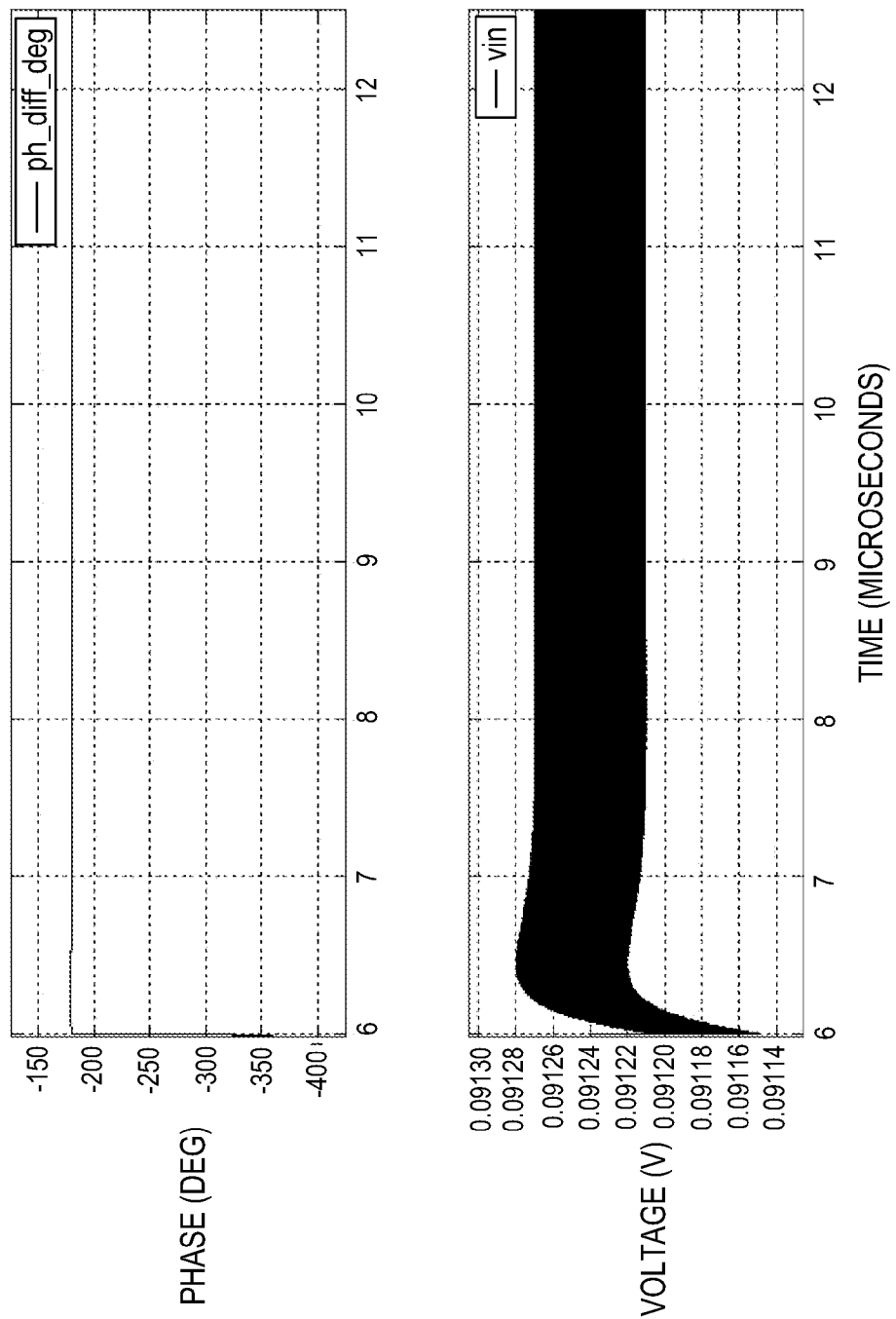
FIG. 8 shows the $\Delta\phi$ and $v_{in}$ performance for the PLL of FIG. 5 when the desired phase shift is 180° and when open-loop phase control is implemented.
Figure 9:
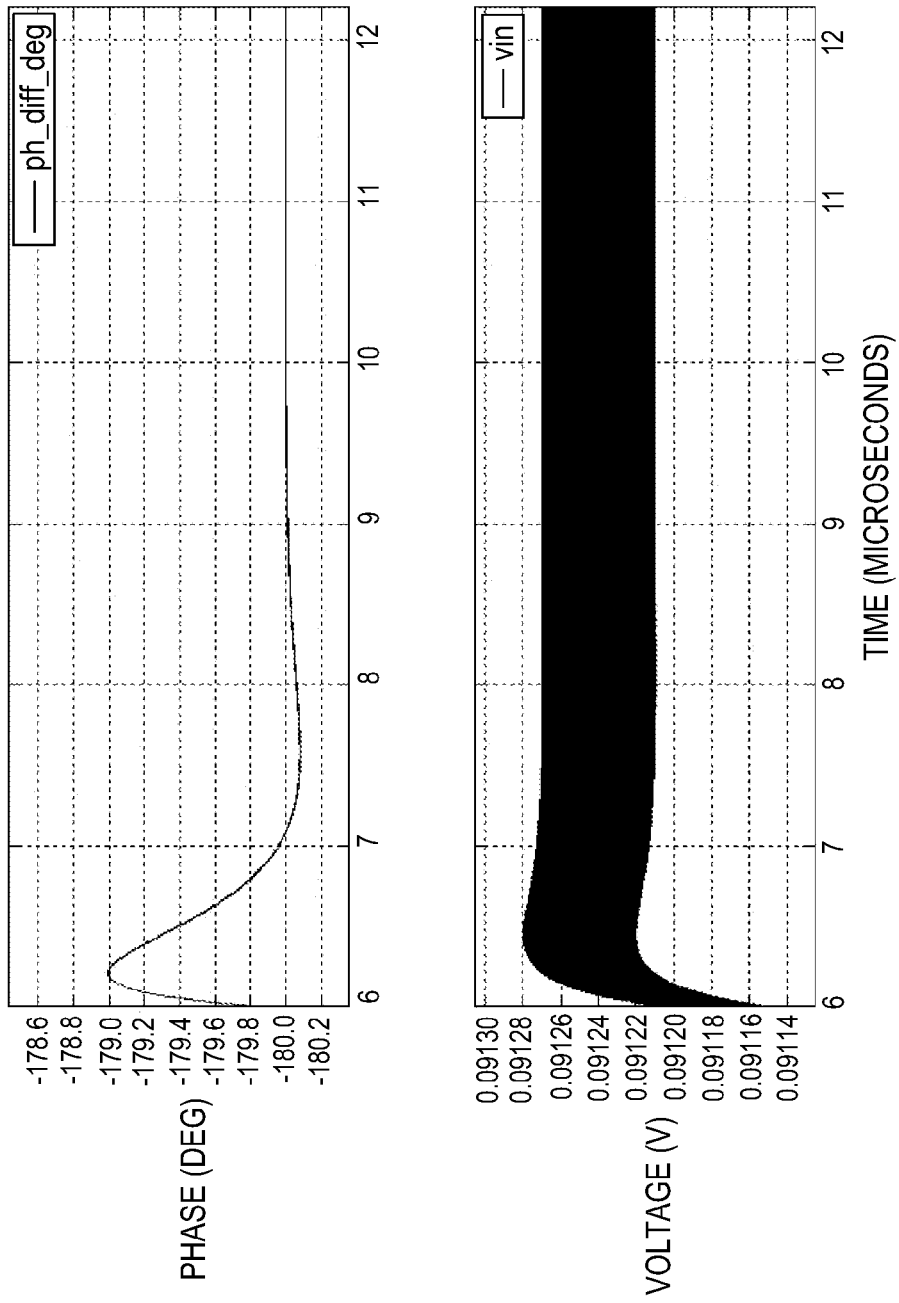
FIG. 9 shows a closer view of the results of FIG. 8.

The modulation circuit 134 applies a phase modulation signal $S_{mod}$ having one or more pulses with a specified total area to more quickly change the output phase of the PLL. In so doing, the modulation circuit 134 bypasses the PLL loop filter 140 altogether, and thus avoids the time constraints introduced by the loop filter 140. FIGS. 8 and 9 show the phase relation when performing a 180° phase shift with a 15 GHz output PLL using the modulation circuit 134. If the pulse(s) of the phase modulation signal is(are) much shorter than the PLL time constant, the loop will react very little to this phase switching mechanism, as shown in FIGS. 8 and 9. In this example, the pulse length is two reference clock cycles, which in this case equals 4.1 ns. The closer view provided by FIG. 9 shows that the phase error never exceeds 1°.

One possible challenge for the open-loop solution provided by the modulation circuit 134 involves the uncertainty surrounding the gain G of the auxiliary input 126. If this gain varies and/or is not the expected gain, the phase shift achieved at the output 122 of the oscillator 120 will deviate from the desired phase shift Δϕ. While the phase skew circuit 132 should ultimately be able to correct this error, the correction effort still suffers from the same time delay problems caused by the time constant of the loop, as discussed above. To address this potential problem, the solution presented herein also provides an optional calibration system 160 (FIG. 10) that calibrates the amplitude A(t) of the phase modulation signal based on the gain G of the auxiliary input 126. The calibration process may be implemented at any time before, during, or after operation of the transmitter or receiver begins. Generally, the calibration system 160 comprises one or more circuits that calibrate the phase modulation signal for one or more desired phase shifts based on a calibration control signal derived from one or more PLL measurements. In one embodiment, the calibration system 160 calibrates the phase modulation signal based on a loop voltage of the PLL 100. This calibration may require one or more executions of the calibration process. The calibration system 160 executes this calibration for at least one carrier frequency set by the PLL 100, and can execute the calibration for multiple carrier frequencies. The results of the calibration process may be stored in memory. For example, a calibrated amplitude determined for each of one or more desired phase shifts and carrier frequencies may be stored in a look-up table. Further, for desired phase shifts having no calibration data, the phase control system 130 can extrapolate the necessary calibration information from the stored calibration data.

Figure 10:
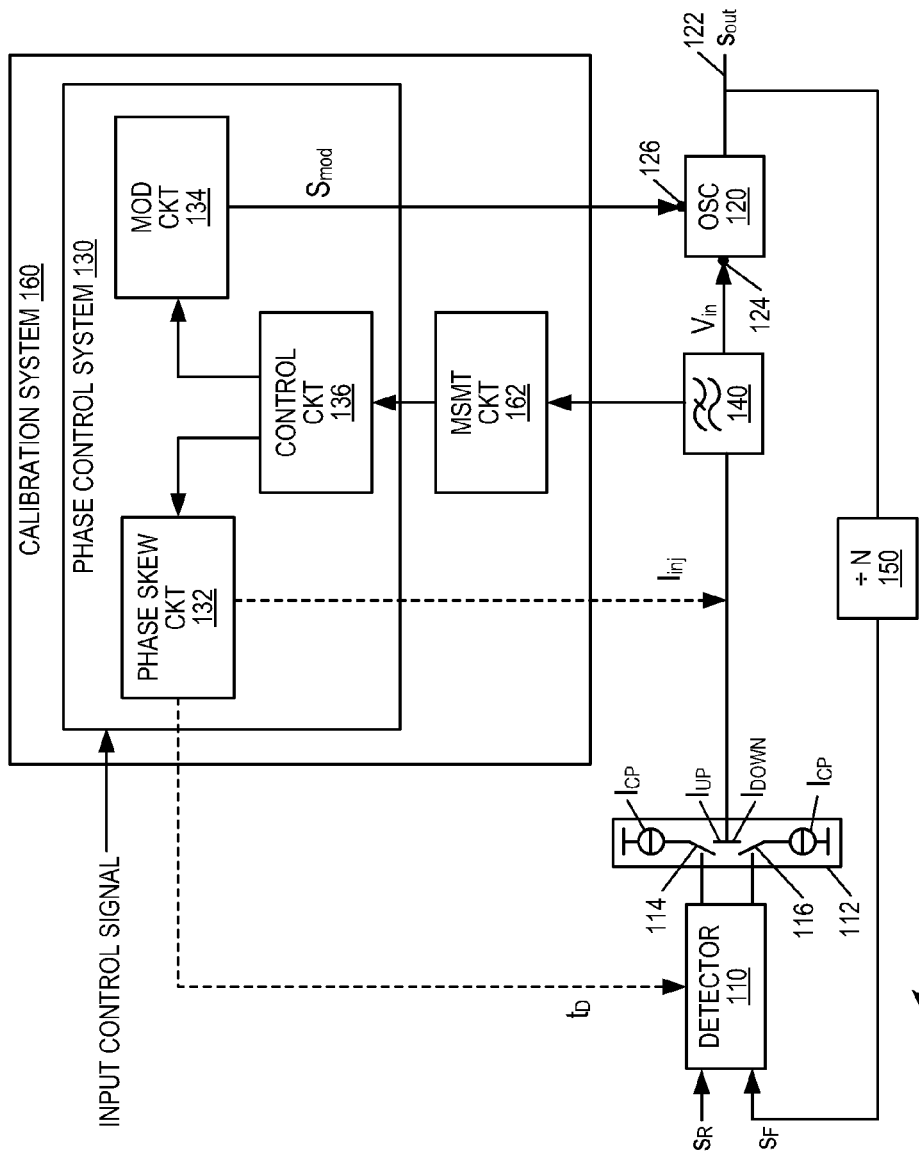
FIG. 10 shows a block diagram of a PLL with a calibration system according to one exemplary embodiment.
Figure 11:
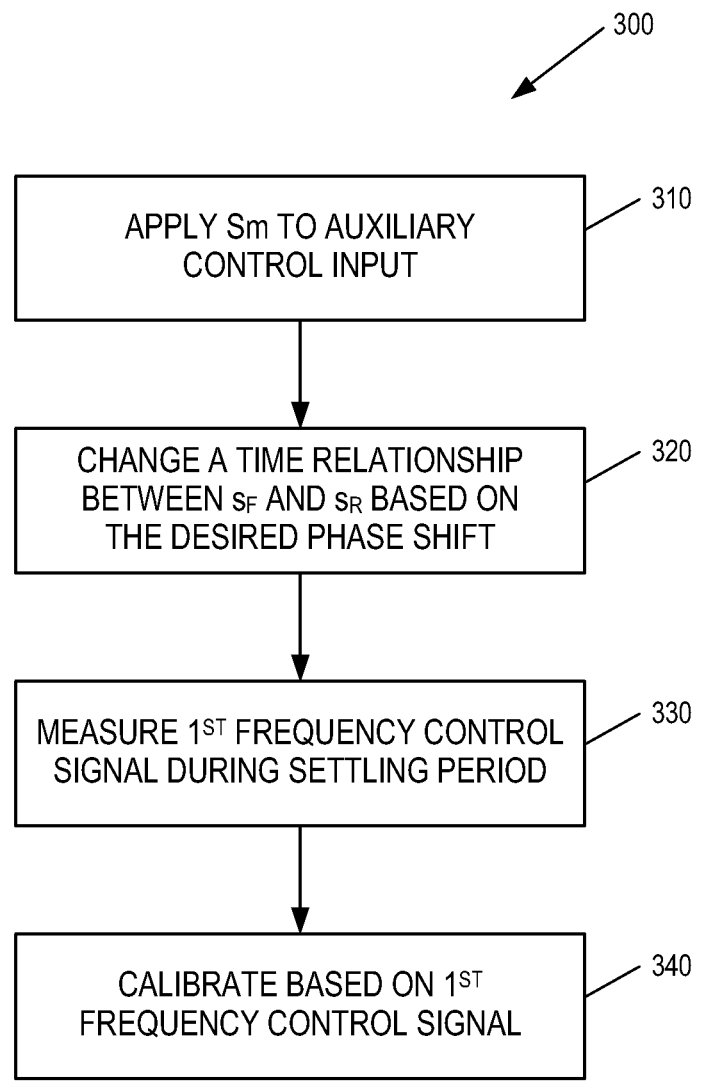
FIG. 11 shows a calibration method according to one exemplary embodiment.

FIG. 10 shows an exemplary calibration system 160 that incorporates a measurement circuit 162 with the phase control system 130. Calibration system 160 executes the calibration process 300 of FIG. 11. To that end, modulation circuit 134 applies a phase modulation signal $S_m$ comprising one or more pulses to the auxiliary input 124 (block 310). The applied phase modulation signal is defined based on an estimate of a total area of the one or more pulses believed necessary to achieve a desired phase shift. The phase skew circuit 132 changes a time relationship between the reference and feedback signals of the PLL 100 based on the desired phase shift (block 320). The measurement circuit 162 measures a first frequency control signal of the PLL 100 at a first time during a settling period of the PLL 100 (block 330). For example, the measurement circuit 162 may measure the loop voltage of the PLL 100. Based on the first frequency control signal, the control circuit 136 calibrates the phase modulation signal (block 340). For example, the control circuit 136 may determine the amplitude of the phase modulation signal necessary to achieve the desired phase shift for that PLL 100. In so doing, the calibration system 160 calibrates for the gain G of the auxiliary input 126 for that carrier frequency and desired phase shift, and thus improves the accuracy of the phase control. While the calibration process 300 may require multiple passes to achieve the desired result, where each pass builds upon knowledge gained from the previous pass, in some embodiments, only one pass through process 300 may be required.

In one embodiment, the calibration system 160 may perform the calibration based on multiple measurements. For example, the measurement circuit 162 may also measure a second frequency control signal at a second time before the modulation circuit applies the phase modulation signal. In this case, the first and second times are separated by a determined time difference derived based on a loop bandwidth of the PLL 100. The control circuit 136 then calibrates the phase modulation signal based on a comparison between the first and second frequency control signals. Again the calibration may be achieved using one or more passes through the calibration process 300.

Figure 12:
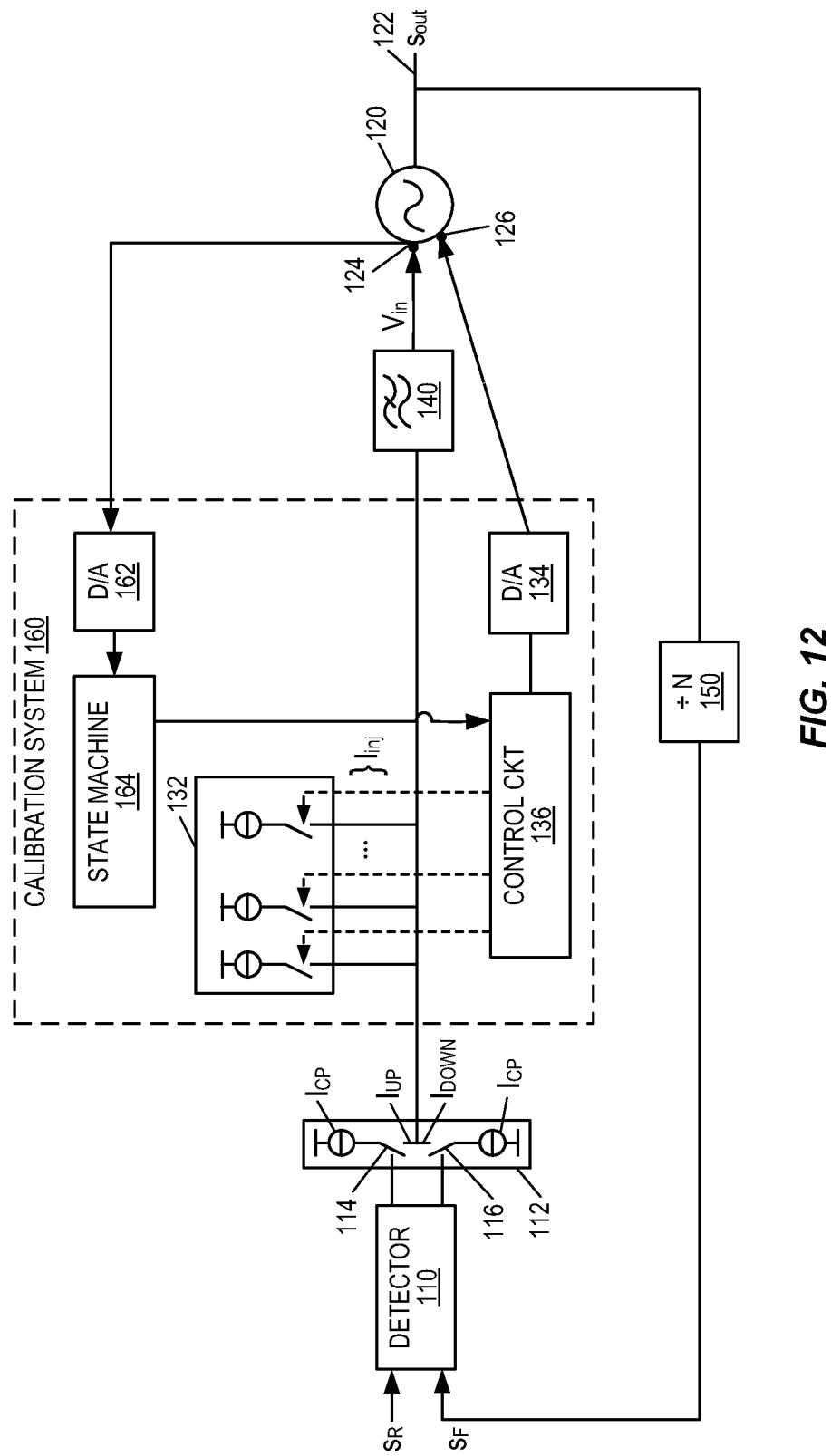
FIG. 12 shows a block diagram of a PLL with a calibration system according to another exemplary embodiment.

FIG. 12 shows an exemplary implementation of the calibration system 160, where the measurement circuit 162 comprises an analog-to-digital converter (ADC) and the modulation circuit 134 comprises a DAC, and where the calibration system 160 further includes a state machine 164. The control circuit 136 applies a code provided by the state machine 164 to the modulation circuit 134 to minimize phase error during settling. The measurement circuit 162 measures the phase error at the primary control input 124, e.g., during settling, and provides the measurement to the state machine 164. For example, the measurement circuit 162 may sample the voltage at the primary control input 124 before the modulation signal is applied to the oscillator 120, and again at one or more time instances during the settling. It will be appreciated that the loop voltage sampled before the modulation signal is applied to the oscillator has a large DC component. The state machine 164 then determines the best code to be used by the control circuit 136 to generate the phase modulation signal necessary to achieve the desired phase shift. For example, the state machine 164 may perform a binary search algorithm to find the best code. The state machine 164 then provides that code to the control circuit 136.

Figure 13:
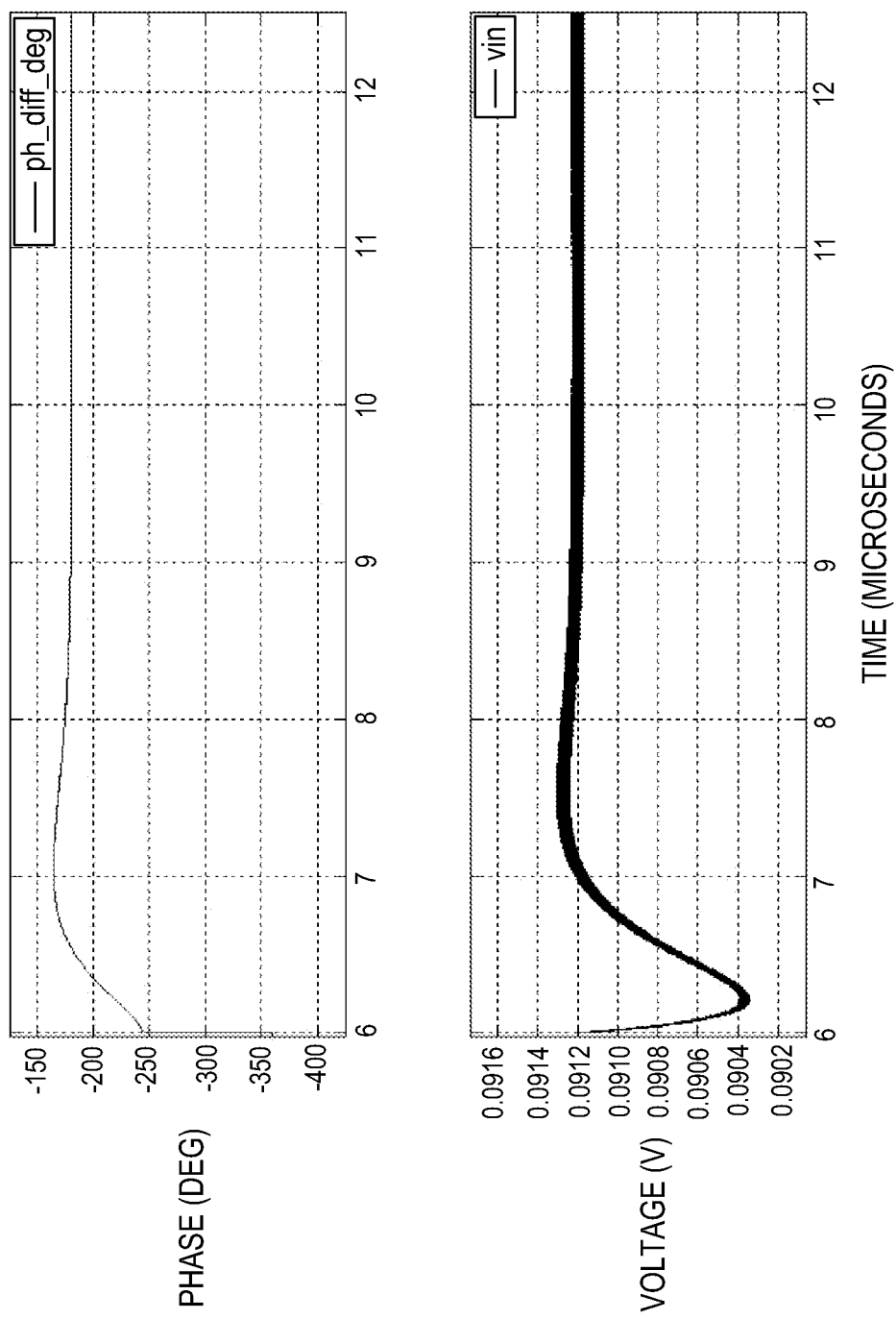
FIGS. 13-18 show the transient response of the phase shift and $v_{in}$ for multiple different calibration passes.
Figure 14:
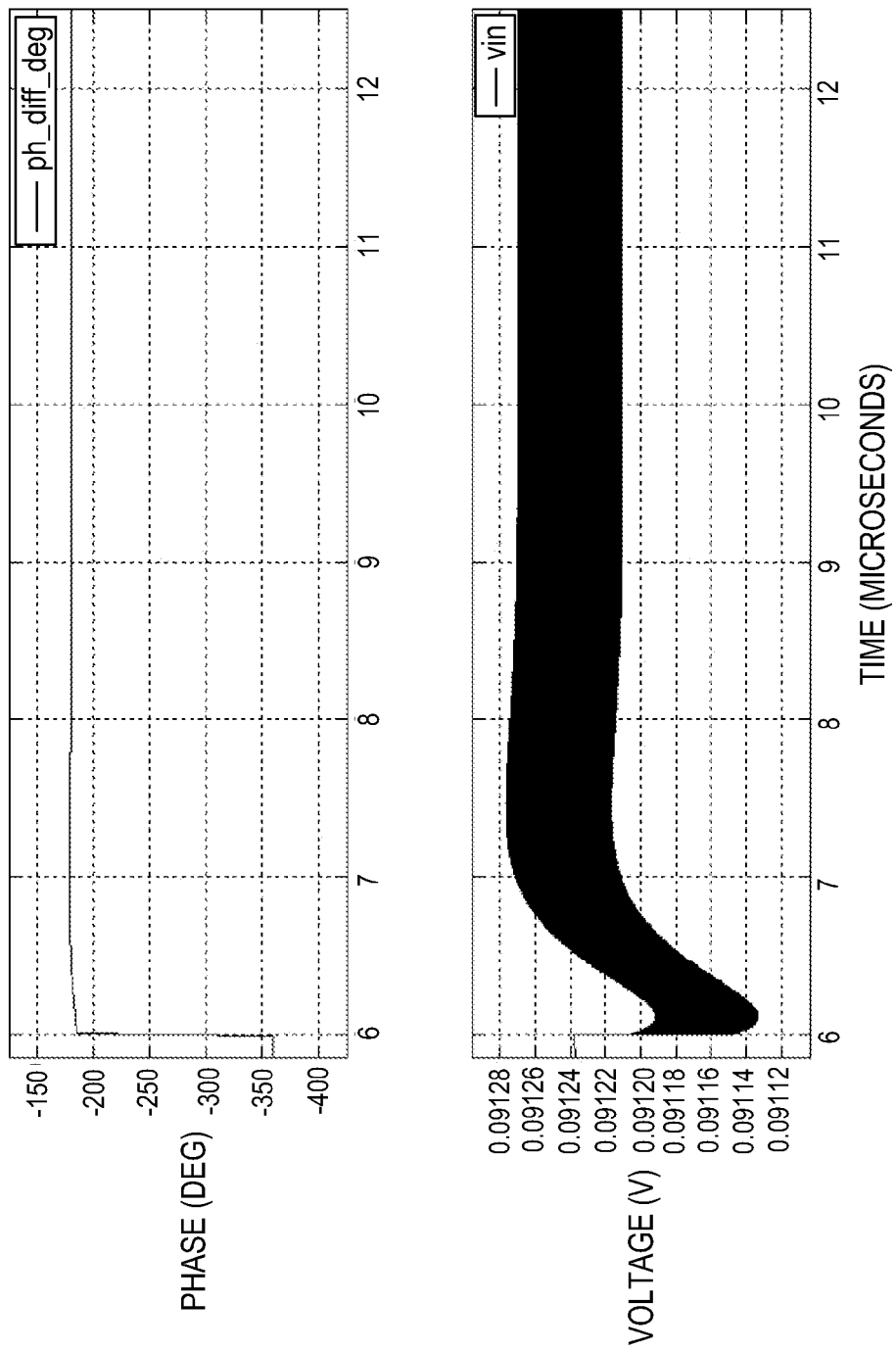
Figure 15:
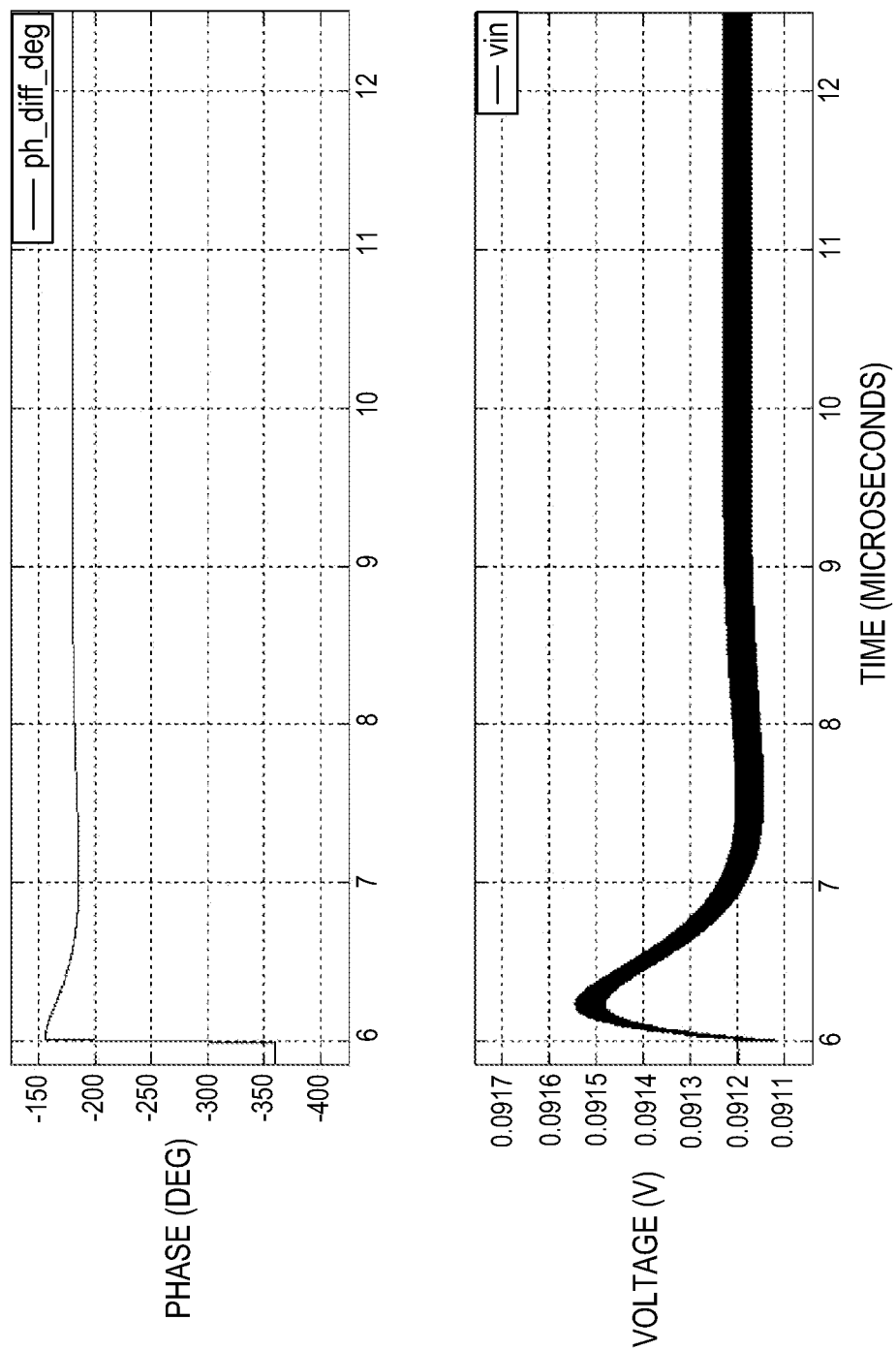
Figure 16:
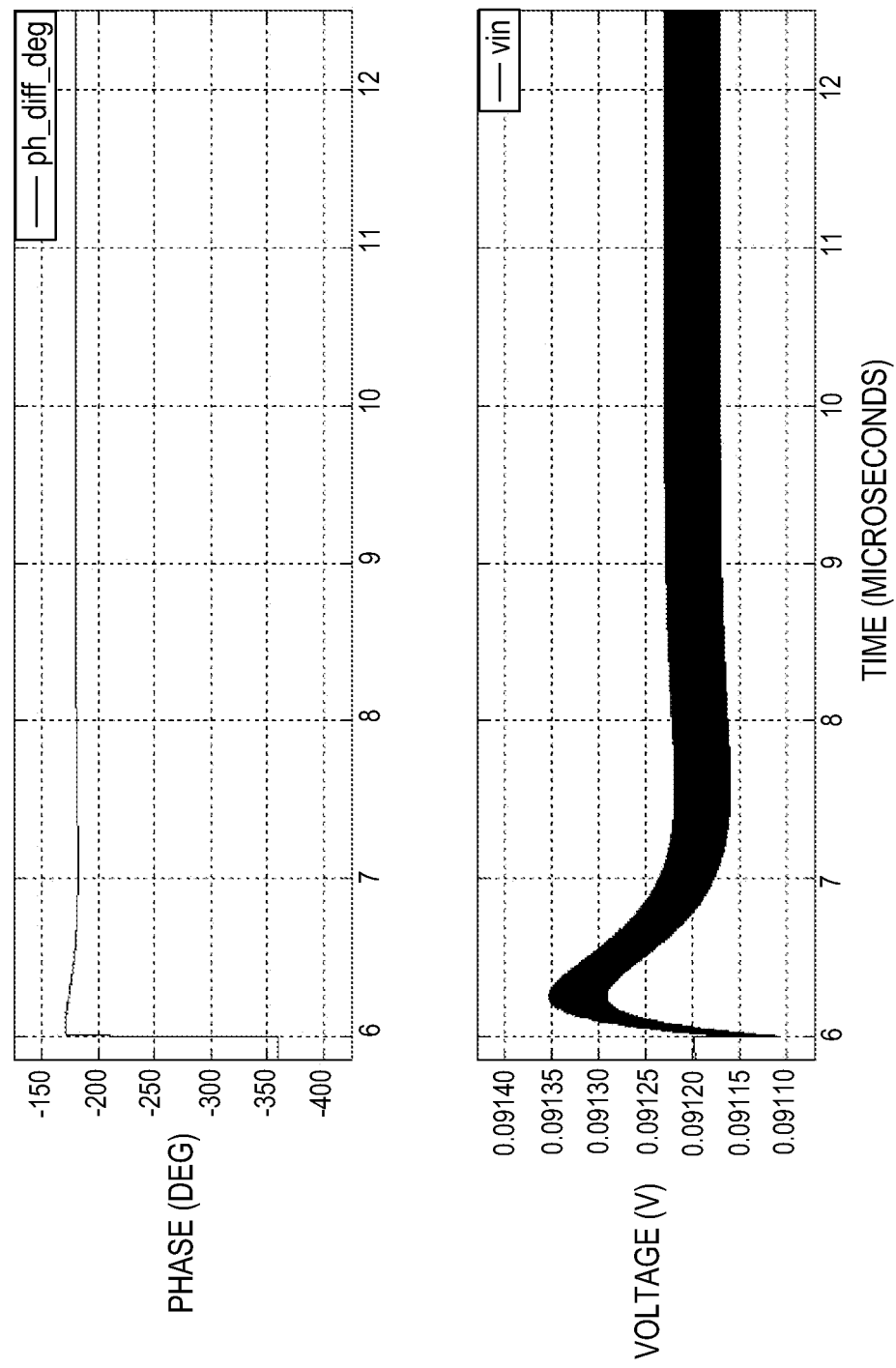
Figure 17:
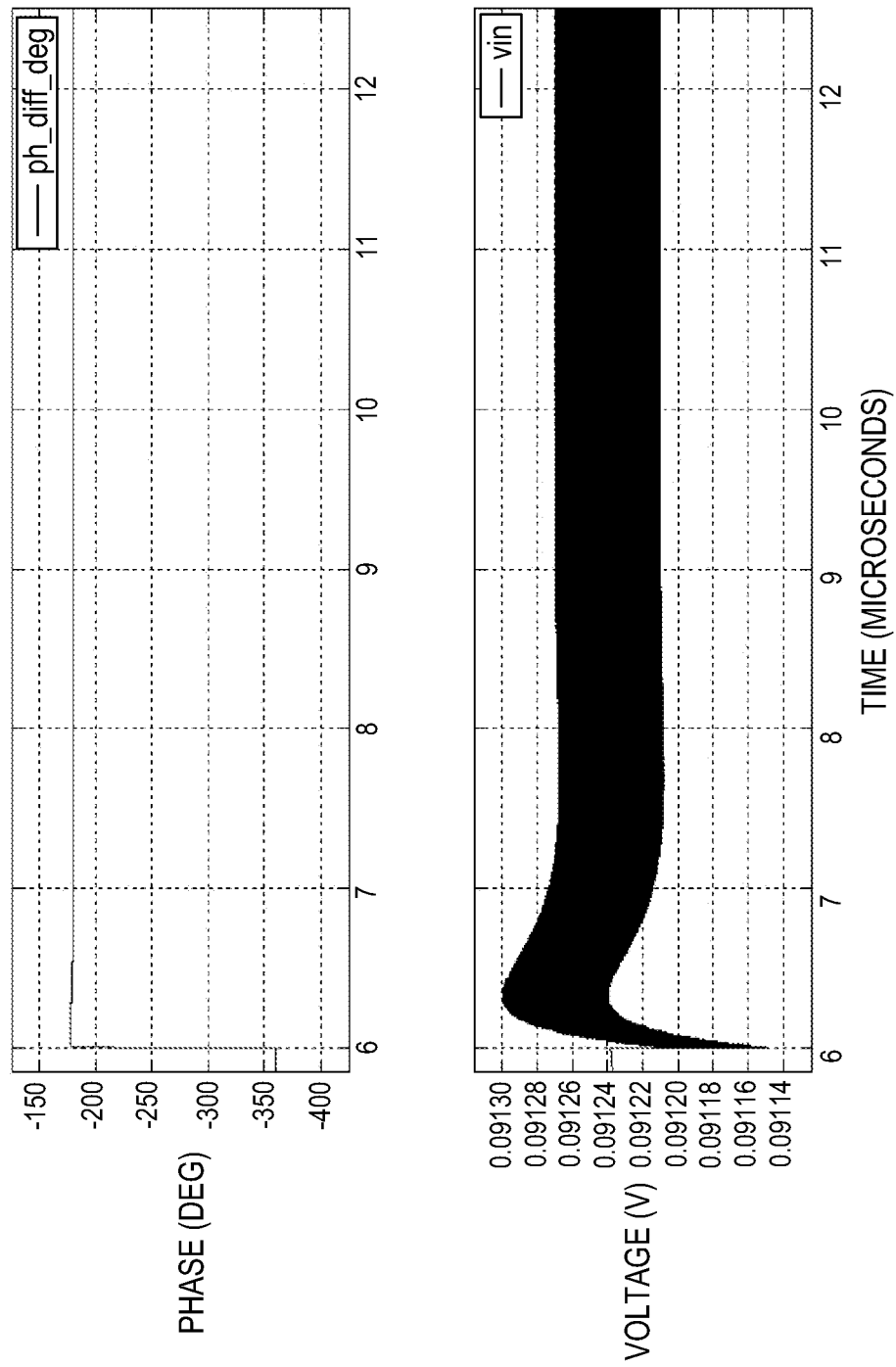
Figure 18:
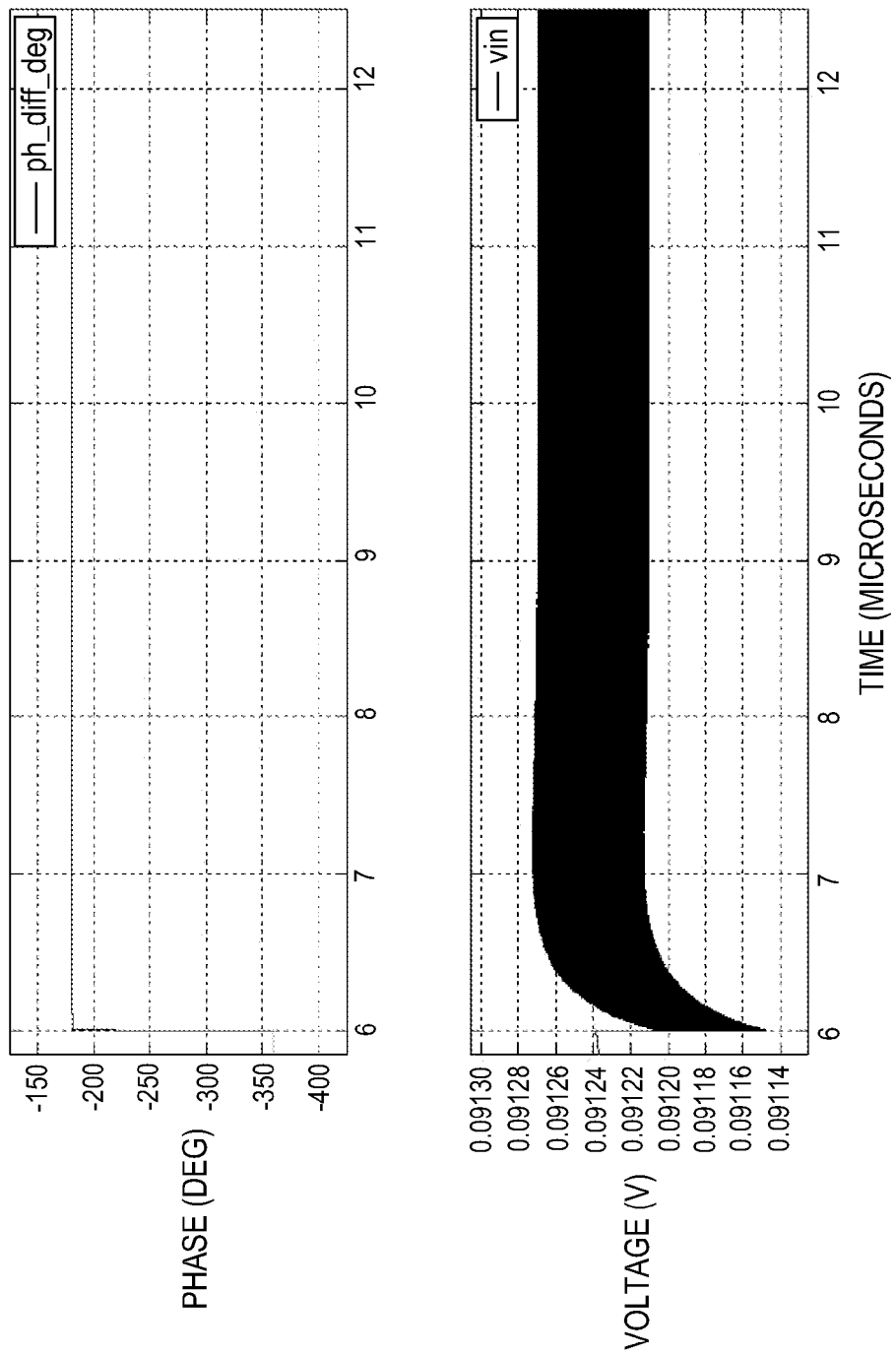

The following provides an exemplary procedure implemented by the calibration system 160 of FIG. 12 to calibrate the phase modulation signal for a desired phase shift of 180°, where a 6-bit DAC is used as the modulation circuit 134. The measurement circuit 162 first measures a voltage at the primary control input 124. State machine 164 supplies code 100000, which is the mid-point of an unsigned 6-bit word range, to the control circuit 136, which applies the selected code to the modulation circuit 134. The modulation circuit 134 generates an analog signal corresponding to the supplied code to modulate the oscillator 120, as described above. Further, the phase skew circuit 132 applies the injection current corresponding to the desired 180° phase shift. After a time determined based on the loop bandwidth of the filter 140, e.g., 0.25 μs, the measurement circuit 162 measures a second voltage at the primary control input 124. This second voltage measurement is then compared to the first voltage measurement, e.g., by state machine 164. If the second voltage is lower than the first voltage, the state machine 164 determines the pulse(s) of the phase modulation signal were not large enough. If the second voltage is greater than the first voltage, the state machine 164 determines the pulse(s) of the phase modulation signal were too large. Thus, the state machine 164 changes the code accordingly. After the loop is allowed to settle, e.g., after 5 μs, the process repeats again. For example, when the second voltage is less than the first voltage, the state machine 164 may select code 110000, and the process then repeats until the difference between the first and second voltages is zero, or at least below some threshold. FIG. 13 shows the transient response of the phase shift and $v_{in}$ when code 100000 is used, FIG. 14 shows the transient response of the phase shift and $v_{in}$ when code 110000 is used, FIG. 15 shows the transient response of the phase shift and $v_{in}$ when code 111000 is used, FIG. 16 shows the transient response of the phase shift and $v_{in}$ when code 110100 is used, FIG. 17 shows the transient response of the phase shift and $v_{in}$ when code 110010 is used, and FIG. 18 shows the transient response of the phase shift and $v_{in}$ when code 110001 is used. As shown by FIGS. 13-18, code 110001 provides the best performance for the desired 180° phase shift. Thus, during operation of the PLL 100, the control circuit 136 will apply code 110001 to the DAC 134 when the desired phase shift is 180°. In this example, the phase control system 130 can achieve the desired 180° phase shift by applying the code 110001 to the modulation circuit 134, where the resulting pulse length is two reference clock cycles. Similarly, because there is a linear relationship between the phase shift and the pulse area, there is also a linear relationship between the phase shift and the number of reference clock cycles. Thus, because the previous example achieved a 180° phase shift with two reference clock cycles, or 90° per reference clock cycle, a 270° phase shift may be achieved by applying the code 110001 to the modulation circuit 134, where the resulting pulse length is three reference clock cycles. Further, finer resolutions may be achieved by using binary weighted varactors. For example, five binary weighted varactors could be used to provide a 3° phase resolution in the above example. If the varactors are small compared to the total tank capacitance of the oscillator 120, the relationship is close to linear, which allows for extrapolation from the calibrated phase shift. In other words, if the phase shift operations are perfectly linear, e.g., there is a constant gain (frequency unit per input quantity unit), the calibration only needs to be performed for one input; all other gains may be determined from the results of this one calibration operation. However, it is more likely that the phase shift operations are not perfectly linear. In this case, the varactors may be characterized through several calibration cycles, which would allow for the use of different digital-to-analog bit patterns for different phase shifts.

Figure 19:
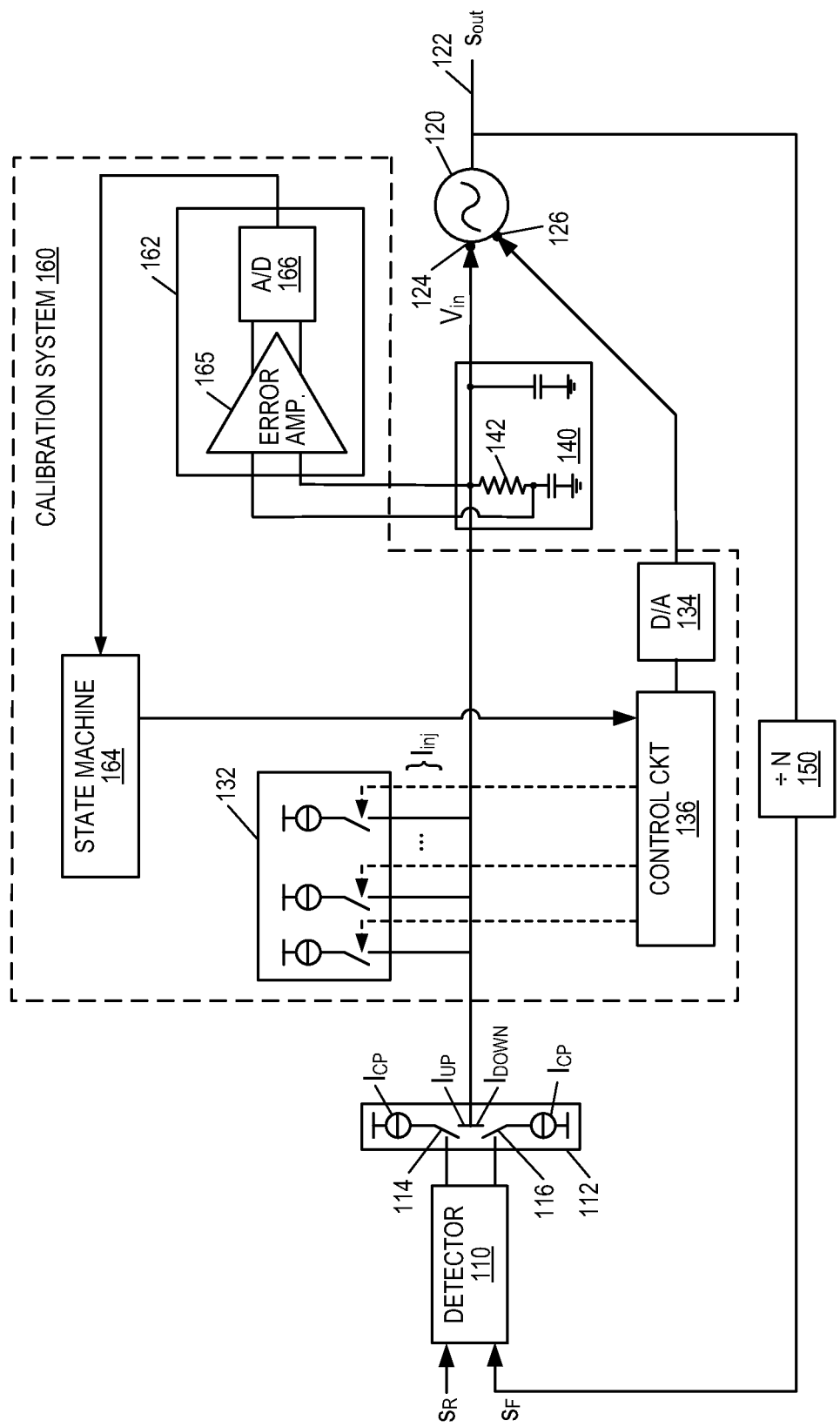
FIG. 19 shows a block diagram of a PLL with a calibration system according to another exemplary embodiment.

FIG. 19 shows another exemplary calibration system 160 where the measurement circuit 162 comprises an error amplifier 164 and an ADC 166, and the loop filter 140 comprises an RC circuit, both of which are connected as shown in FIG. 19. In this example, only one measurement is required, e.g., during the settling period. More particularly, during settling, the measurement circuit 162 measures the voltage across the loop filter zero resistor 142. This measurement provides a measure of where the loop is pulling the oscillator frequency. After settling, this voltage is zero. But during the settling period, this voltage is non-zero, which indicates the loop is reacting and how the modulation pulse needs to be adjusted. Because the approach of FIG. 19 effectively removes the large DC component (e.g., associated with the non-settling period calibration operation of FIG. 12), the measurement circuit 162 for this example can use an ADC with a lower dynamic range.

Figure 20:
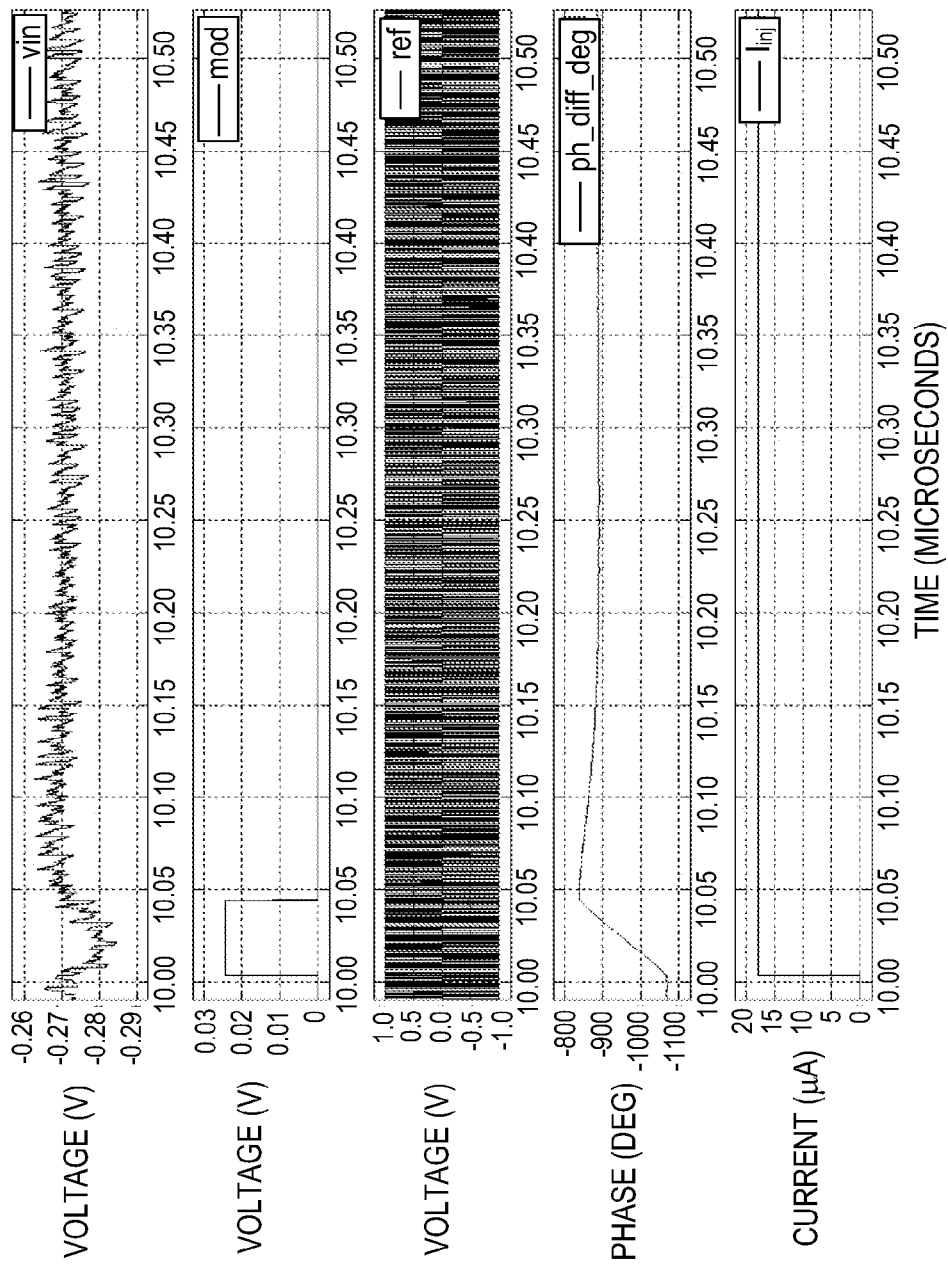
FIG. 20 shows the performance of phase control during operation of the PLL and/or during the calibration process when the current is injected with a single pulse.
Figure 21:
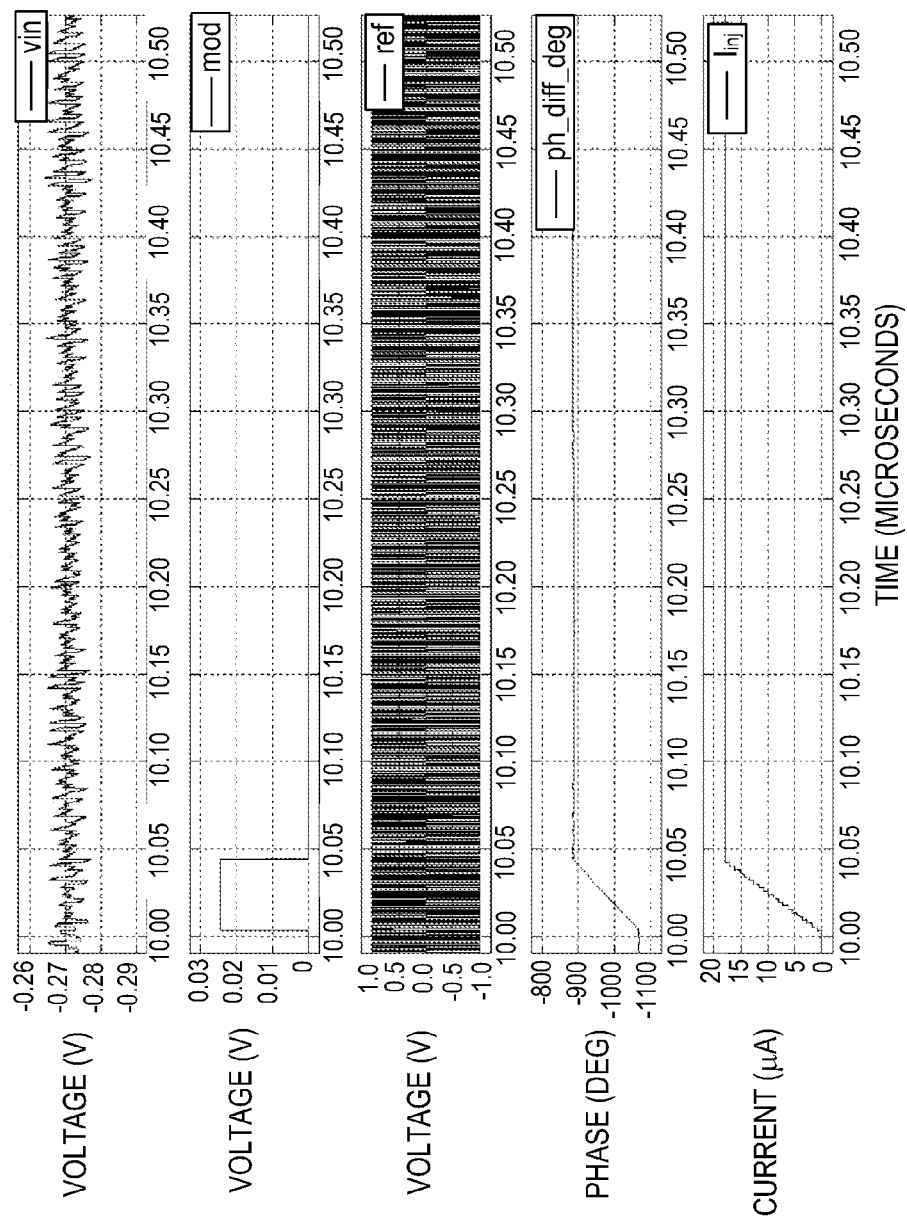
FIG. 21 shows the performance of phase control during operation of the PLL and/or during the calibration process when the current is injected as a ramp.

As noted above, the phase skew circuit 132 controls the output phase of the PLL 100 by setting a time relationship between the reference and feedback signals, e.g., by injecting current having an amplitude derived based on the desired phase shift into the loop filter 140. While the phase skew circuit 132 may inject current by setting the amplitude of the injected current directly to the desired amplitude, this approach may cause perturbations in the loop. See FIG. 20. An alternate approach would be to ramp the injected current to the desired amplitude by providing, e.g., a smooth ramp with a gradual step-by-step increment every reference clock cycle, where the duration of the ramp equals the duration of the pulse(s) of the phase modulation signal. As shown in FIG. 21, the loop of the PLL 100 does not react to the current injection via the ramp approach, which enables the phase transition to occur more quickly and without undesirable signal artifacts. It will be appreciated that this ramp-style of injecting current may be used for both operation and calibration. It will further be appreciated that this ramp-style approach may also be used when directly controlling the time relationship between the reference signal and the feedback signal by applying the time offset $t_D$ in detector 110.

While the solution presented herein is presented in terms of a PLL 100 used with an antenna element 22 of an antenna array 20, it will be appreciated that the solution is not so limited. The PLL 100 disclosed herein may be used for any system where controlling the phase of the PLL output signal is desired or necessary. Further, the solution presented herein is not limited to analog PLLs with loop filter current injection closed-loop phase control. The open-loop phase control disclosed herein may be used along with other digital and/or analog closed-loop phase control solutions.

Various elements disclosed herein are described as some kind of circuit, e.g., a phase skew circuit, modulation circuit, control circuit, measurement selection circuit, etc. Each of these circuits may be embodied in hardware and/or in software (including firmware, resident software, microcode, etc.) executed on a controller or processor, including an application specific integrated circuit (ASIC).

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A phase-locked loop (PLL) comprising:
 an oscillator configured to generate an output signal at an output of the PLL responsive to a reference signal input to the PLL, the oscillator including a primary control input and a separate auxiliary control input;
 a detector configured to compare the reference signal to a feedback signal to generate one or more PLL control signals, the feedback signal being derived by a feedback loop of the PLL from the output signal; and a phase control system configured to control a phase of the output signal to achieve a desired phase shift at the output of the PLL, the phase control system comprising:
  a modulation circuit operatively coupled to the oscillator and configured to execute open loop phase control of the PLL by:
    generating a phase modulation signal comprising one or more pulses having a total area defined based on the desired phase shift; and
    applying the phase modulation signal to the auxiliary control input to change the phase of the output of the PLL to achieve the desired phase shift; and
  a phase skew circuit configured to execute closed-loop phase control of the PLL to maintain the phase of the output of the PLL at the desired phase shift by setting a time relationship between the reference signal and the feedback signal based on the desired phase shift.

2. The PLL of claim 1 wherein the total area of the one or more pulses of the phase modulation signal is derived from a fixed pulse amplitude and one or more variable pulse durations defined based on the desired phase shift.

3. The PLL of claim 1 wherein the PLL comprises:
  a charge pump operatively connected between the detector and the primary control input of the oscillator; and
  a loop filter operatively connected between the charge pump and the primary control input of the oscillator,
  wherein the phase skew circuit is configured to set the time relationship between the reference signal and the feedback signal by injecting a current into the loop filter or by leaking the current out of the loop filter, wherein the phase skew circuit sets the magnitude of the injected or leaked current based on the desired phase shift.

4. The PLL of claim 1 wherein the phase skew circuit is configured to set the time relationship between the reference signal and the feedback signal by applying a time delay determined based on the desired phase shift to at least one of the reference signal and the feedback signal such that the time relationship between the reference signal and the feedback signal is established based on the desired phase shift.

5. The PLL of claim 1 wherein the output of the PLL is operatively coupled to an antenna element of an antenna array of at least one of a beam-forming transmitter and a beam-forming receiver, and wherein the PLL is used to at least one of downconvert signals received by the antenna element and upconvert signals to be transmitted by the antenna element.

6. The PLL of claim 5 wherein one of the phase control system and an external array control circuit selects the desired phase shift based on a location of the antenna element in the antenna array and at least one of a desired beam direction and beam shape of the beam-forming transmitter or receiver.

7. The PLL of claim 1 wherein the phase control system further comprises a control circuit configured to generate the phase modulation signal for the open-loop phase control based on the desired phase shift, and wherein the control circuit is further configured to define the time relationship between the reference signal and the feedback signal for the closed-loop phase control based on the desired phase shift.

8. The PLL of claim 1 further comprising a calibration circuit configured to calibrate, for at least one carrier frequency set by the PLL, the phase modulation signal for one or more desired phase shifts based on a calibration control signal derived from one or more PLL measurements.

9. The PLL of claim 8 wherein the calibration circuit calibrates the phase modulation signal by calibrating an amplitude of the one or more pulses of the phase modulation signal for each of the one or more desired phase shifts based on the calibration control signal.

10. The PLL of claim 8 wherein the calibration control signal comprises a loop voltage of the PLL.

11. A method of controlling a phase at an output of a phase-locked loop (PLL) to achieve a desired phase shift at the output of the PLL, the PLL comprising an oscillator configured to generate an output signal at the output of the PLL responsive to a reference signal input to the PLL, the oscillator including a primary control input and a separate auxiliary control input, and a detector configured to compare the reference signal to a feedback signal to generate one or more PLL control signals, the feedback signal being derived by a feedback loop of the PLL from the output signal, the method comprising:
  executing open-loop phase control of the PLL by:
    generating a phase modulation signal comprising one or more pulses having a total area defined based on the desired phase shift; and
    applying the phase modulation signal to the auxiliary control input to change the phase of the output of the PLL to achieve the desired phase shift; and
  executing closed-loop phase control of the PLL to maintain the phase of the output of the PLL at the desired phase shift by setting a time relationship between the reference signal and the feedback signal based on the desired phase shift.

12. The method of claim 11 further comprising defining the total area of the one or more pulses of the phase modulation signal based on a fixed pulse amplitude and one or more variable pulse durations defined based on the desired phase shift.

13. The method of claim 11 wherein the PLL comprises a charge pump operatively connected between the detector and the primary control input of the oscillator and a loop filter operatively connected between the charge pump and the primary control input of the oscillator, and wherein setting the time relationship between the reference signal and the feedback signal comprises injecting a current into the loop filter or by leaking the current out of the loop filter, wherein the phase skew circuit sets the magnitude of the injected or leaked current based on the desired phase shift.

14. The method of claim 11 further comprising determining a time delay based on the desired phase shift, wherein setting the time relationship between the reference signal and the feedback signal comprises applying the time delay to at least one of the reference signal and the feedback signal such that the time relationship between the reference signal and the feedback signal is established based on the desired phase shift.

15. The method of claim 11 wherein the output of the PLL is operatively coupled to an antenna element of an antenna array of at least one of a beam-forming transmitter and a beam-forming receiver, the method further comprising using the PLL to at least one of downconvert signals received by the antenna element and upconvert signals to be transmitted by the antenna element.

16. The method of claim 15 further comprising selecting the desired phase shift based on a location of the antenna element in the antenna array and at least one of a desired beam direction and beam shape of the beam-forming transmitter or receiver.

17. The method of claim 11 further comprising calibrating, for at least one carrier frequency set by the PLL, the phase modulation signal for one or more desired phase shifts based on a calibration control signal derived by one or more PLL measurements.

18. The method of claim 17 wherein calibrating the phase modulation signal comprises calibrating an amplitude of the one or more pulses of the phase modulation signal for each of the one or more desired phase shifts based on the calibration control signal.

19. The method of claim 17 wherein the calibration control signal comprises a loop voltage of the PLL.

20. A method of calibrating open-loop phase control of a phase-locked loop (PLL) to achieve a desired phase shift at an output of the PLL, the PLL comprising an oscillator configured to generate an output signal at the output of the PLL responsive to a reference signal input to the PLL, the oscillator including a primary control input and a separate auxiliary control input, and a detector configured to compare the reference signal to a feedback signal to generate one or more PLL control signals, the feedback signal being derived by a feedback loop of the PLL from the output of the PLL, the method comprising:
applying a phase modulation signal comprising one or more pulses to the auxiliary control input, wherein the phase modulation signal is defined based on an estimate of a total area of the one or more pulses necessary to achieve the desired phase shift; and
changing a time relationship between the reference signal and the feedback signal based on the desired phase shift;
measuring a first frequency control signal of the PLL at a first time during a settling period of the PLL; and
calibrating the phase modulation signal based on the first frequency control signal.

21. The method of claim 20 wherein calibrating the phase modulation signal comprises calibrating an amplitude of the one or more pulses of the phase modulation signal for each of the one or more desired phase shifts based on the first frequency control signal.

22. The method of claim 20 further comprising measuring a second frequency control signal at a second time before the first time and before the application of the phase modulation signal, wherein the first and second times are separated by a determined time difference derived based on a loop bandwidth of the PLL, and wherein calibrating the phase modulation signal comprises calibrating the phase modulation signal based on a comparison between the first and second frequency control signals.

23. The method of claim 20 wherein at least one of the first and second frequency control signals comprises a loop filter voltage associated with a loop filter of the PLL.

24. The method of claim 20 wherein at least one of the first and second frequency control signals comprises a voltage measured at the primary control input.

25. A calibration system for calibrating open-loop phase control of a phase-locked loop (PLL) to achieve a desired phase shift at an output of the PLL, the PLL comprising an oscillator configured to generate an output signal at the output of the PLL responsive to a reference signal input to the PLL, the oscillator including a primary control input and a separate auxiliary control input, and a detector configured to compare the reference signal to a feedback signal to generate one or more PLL control signals, the feedback signal being derived by a feedback loop of the PLL from the output of the PLL, the calibration system comprising:
a modulation circuit configured to apply a phase modulation signal comprising one or more pulses to the auxiliary control input, wherein the phase modulation signal is defined based on an estimate of a total area of the one or more pulses necessary to achieve the desired phase shift; and
a phase skew circuit configured to change a time relationship between the reference signal and the feedback signal based on the desired phase shift;
a measurement circuit configured to measure a first frequency control signal of the PLL at a first time during a settling period of the PLL; and
a control circuit is configured to calibrate the phase modulation signal based on the first frequency control signal.

26. The calibration system of claim 25 wherein the control circuit calibrates the phase modulation signal by calibrating an amplitude of the one or more pulses of the phase modulation signal for each of the one or more desired phase shifts based on the first frequency control signal.

27. The calibration system of claim 25 wherein the measurement circuit is further configured to measure a second frequency control signal at a second time before the first time and before the control circuit applies the phase modulation signal, wherein the first and second times are separated by a determined time difference derived based on a loop bandwidth of the PLL, and wherein the control circuit is configured to calibrate the phase modulation signal by calibrating the phase modulation signal based on a comparison between the first and second frequency control signals.

28. The calibration system of claim 27 wherein:
the oscillator comprises an analog frequency control;
the control circuit comprises a digital control circuit;
the modulation circuit comprises a digital-to-analog converter operatively connected between the digital control circuit and the oscillator; and
the digital-to-analog converter is configured to apply the phase modulation signal to the oscillator responsive to an input code provided by the digital control circuit, the digital control circuit selecting the input code based on the comparison between the first and second frequency control signals.

29. The calibration system of claim 27 wherein the phase skew circuit comprises one or more current injector circuits selectively and operatively connected to an output of the detector, wherein the digital control circuit controls an amplitude of the current applied by the one or more current injector circuits based on the desired phase shift.

* * * * *